United States Patent
Shieh et al.

(10) Patent No.: US 8,847,295 B2
(45) Date of Patent: Sep. 30, 2014

(54) STRUCTURE AND METHOD FOR FABRICATING FIN DEVICES

(71) Applicant: Taiwan Semiconductor Manufacturing Company, Ltd., Hsin-Chu (TW)

(72) Inventors: Ming-Feng Shieh, Yongkang (TW); Chih-Hao Yu, Tainan (TW); Chang-Yun Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/957,108

(22) Filed: Aug. 1, 2013

(65) Prior Publication Data

US 2013/0313646 A1    Nov. 28, 2013

Related U.S. Application Data

(63) Continuation of application No. 13/335,479, filed on Dec. 22, 2011, now Pat. No. 8,513,078.

(51) Int. Cl.
*H01L 29/76* (2006.01)
*H01L 29/78* (2006.01)
*H01L 21/84* (2006.01)
*H01L 21/8234* (2006.01)

(52) U.S. Cl.
CPC .......... *H01L 29/7855* (2013.01); *H01L 21/845* (2013.01); *H01L 21/823431* (2013.01)
USPC ................ 257/288; 257/E27.06; 257/E29.13; 257/E29.131; 257/287; 257/324; 257/331; 257/365; 257/368; 257/401

(58) Field of Classification Search
USPC ............... 257/E27.06, E29.13, E29.131, 287, 257/288, 324, 331, 365, 368, 401
See application file for complete search history.

(56) References Cited

U.S. PATENT DOCUMENTS

| | | |
|---|---|---|
| 2005/0156171 A1 | 7/2005 | Brask et al. |
| 2011/0147848 A1* | 6/2011 | Kuhn et al. ............ 257/368 |
| 2012/0241864 A1 | 9/2012 | Gerhardt et al. |

* cited by examiner

*Primary Examiner* — Asok K Sarkar
(74) *Attorney, Agent, or Firm* — Slater & Matsil, L.L.P.

(57) ABSTRACT

A structure and method of forming a semiconductor device with a fin is provided. In an embodiment a hard mask is utilized to pattern a gate electrode layer and is then removed. After the hard mask has been removed, the gate electrode layer may be separated into individual gate electrodes.

20 Claims, 32 Drawing Sheets

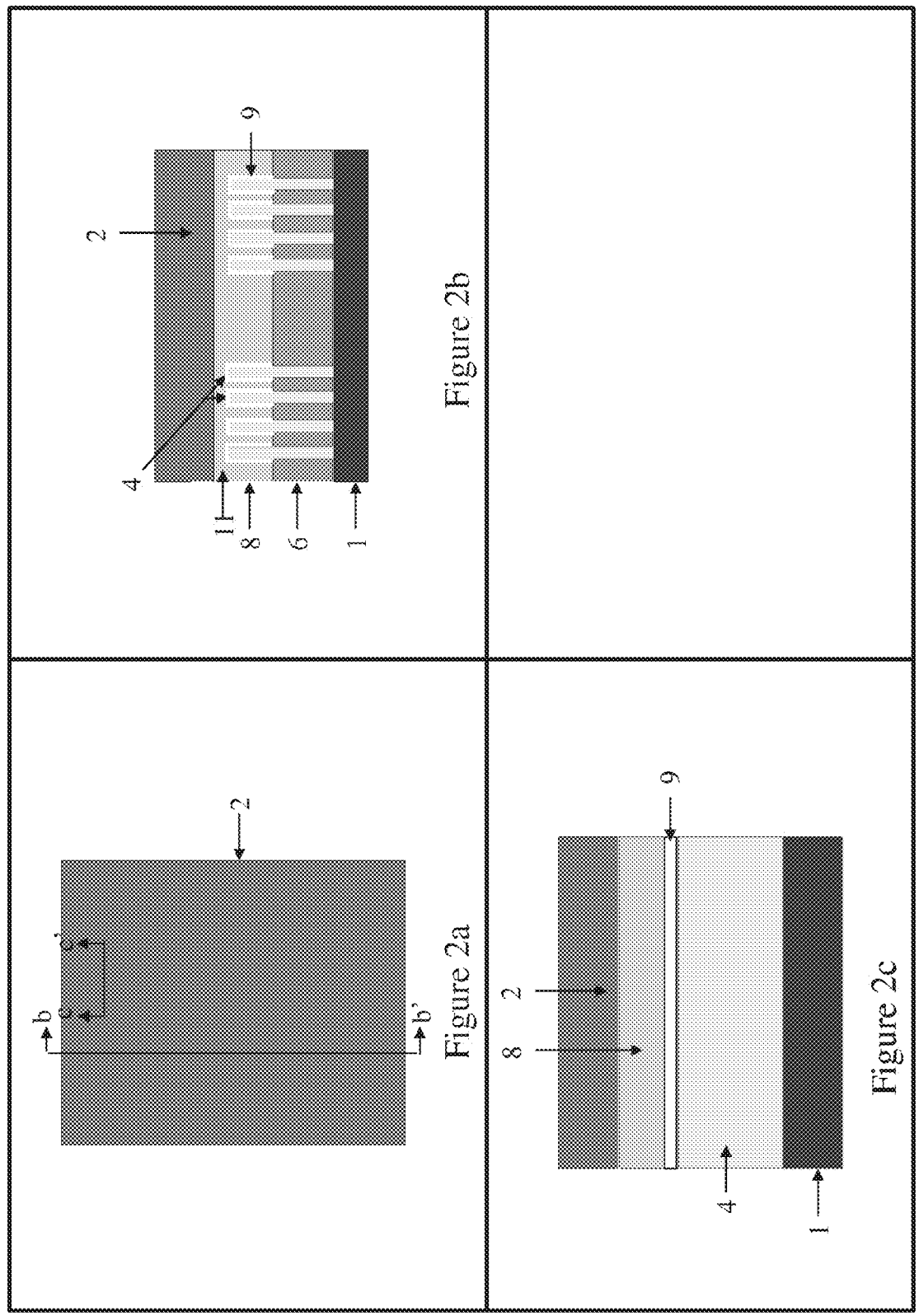

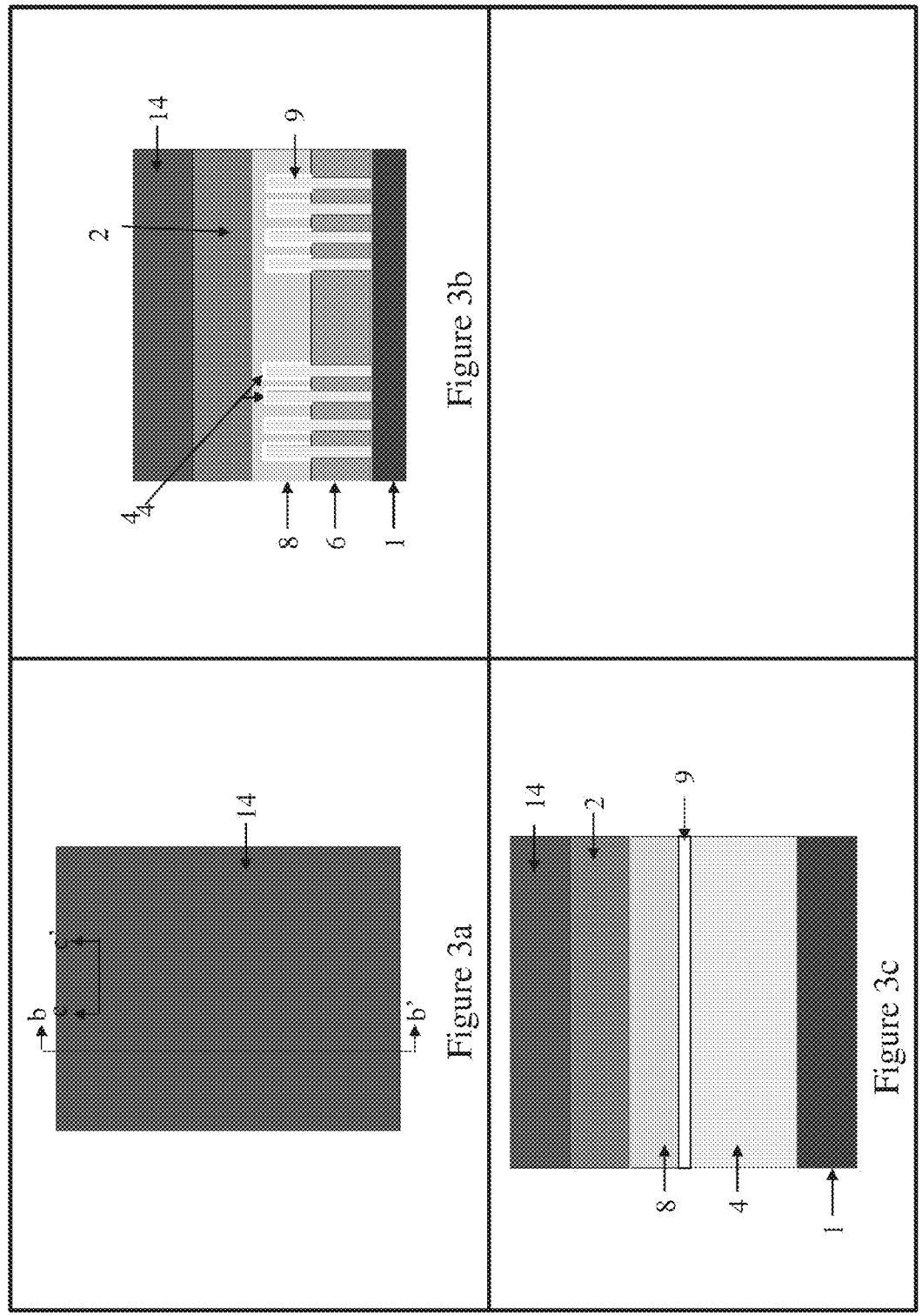

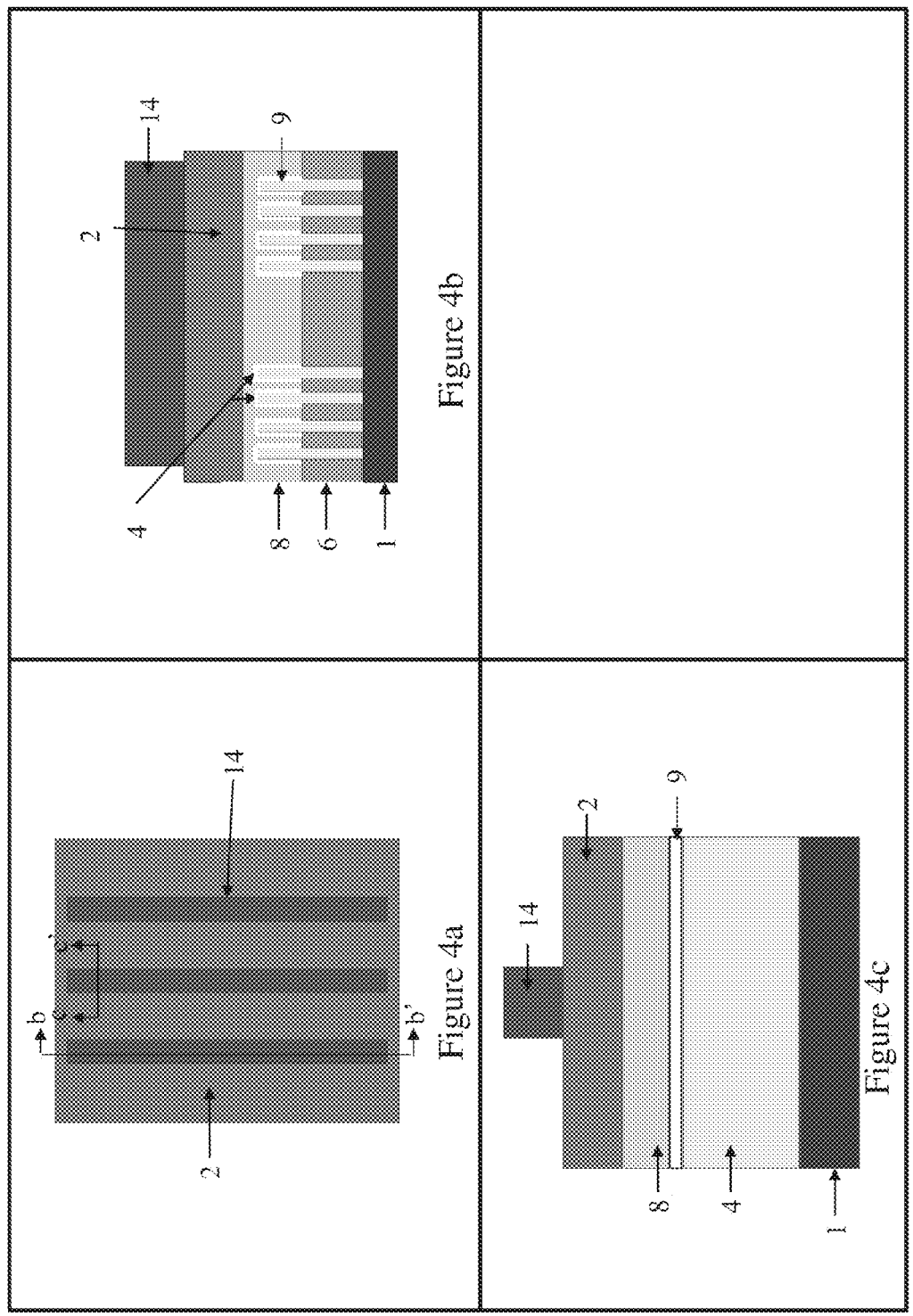

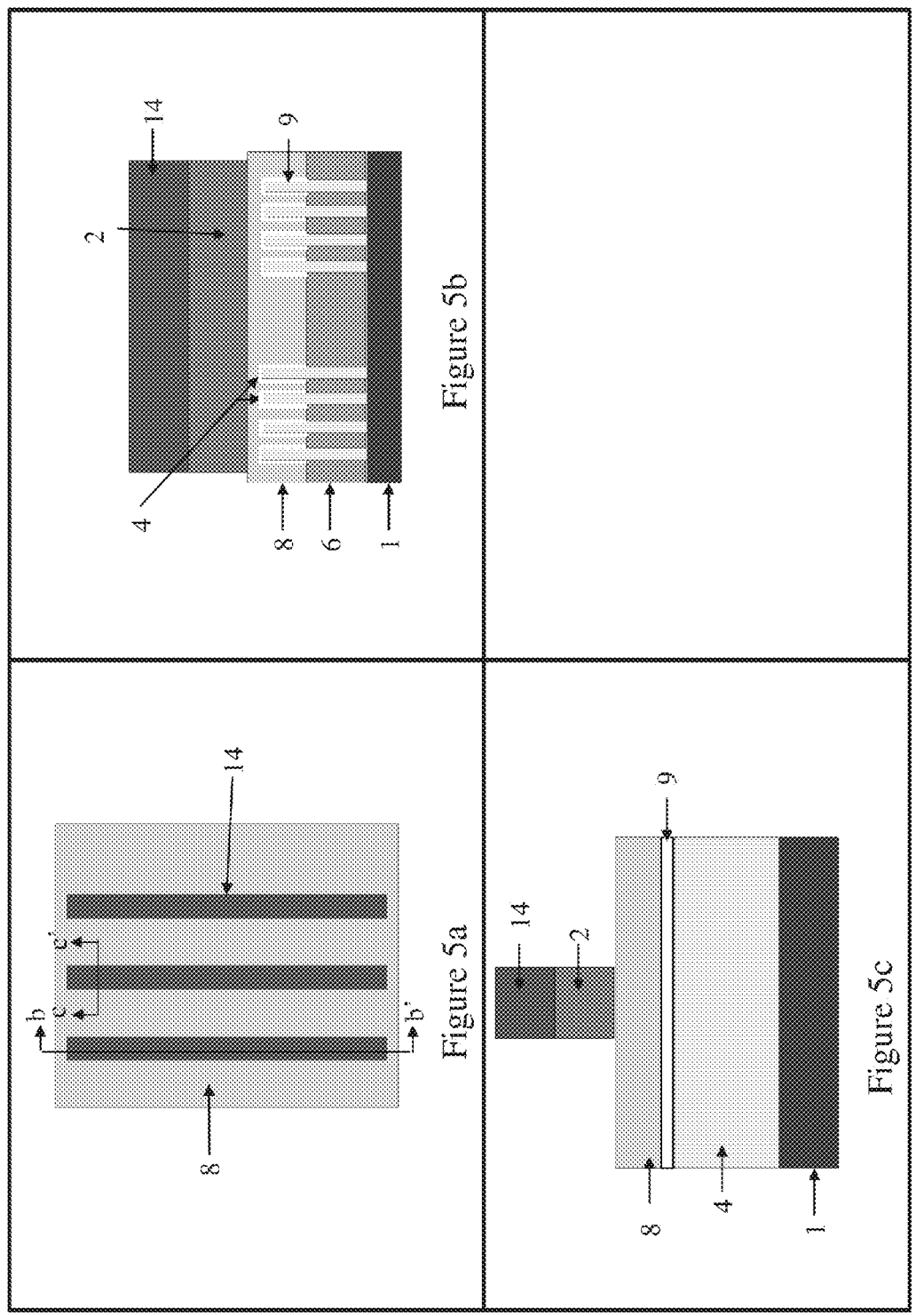

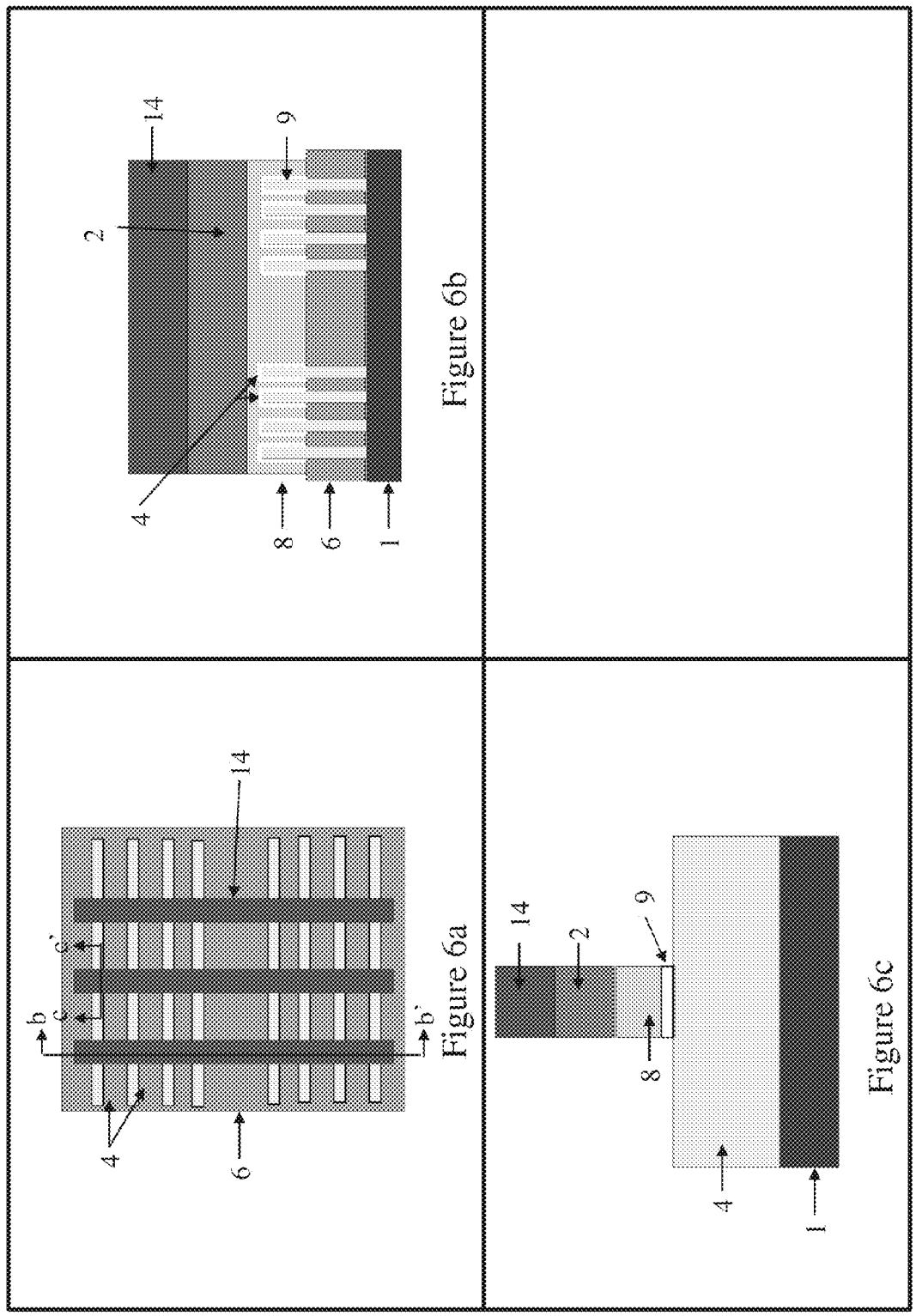

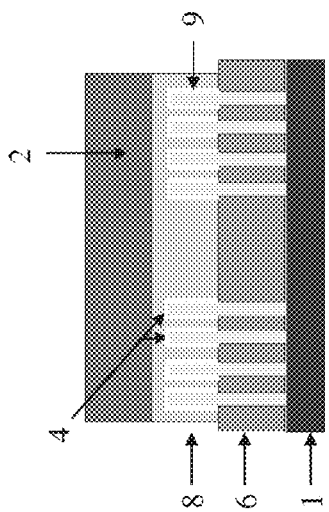
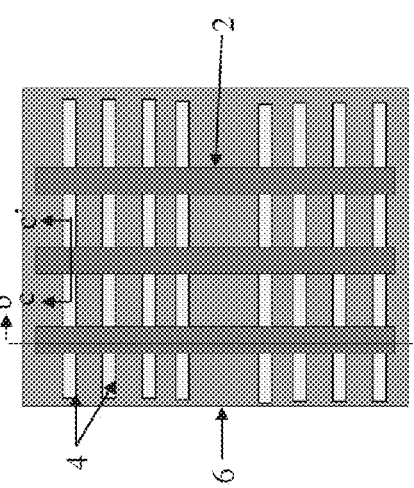
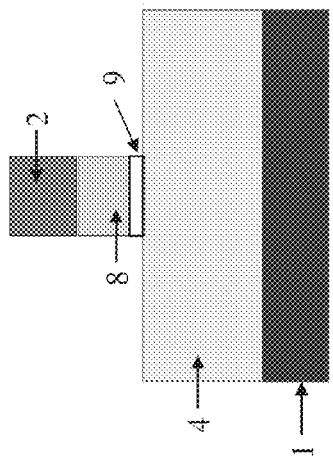
Figure 7a
Figure 7b
Figure 7c

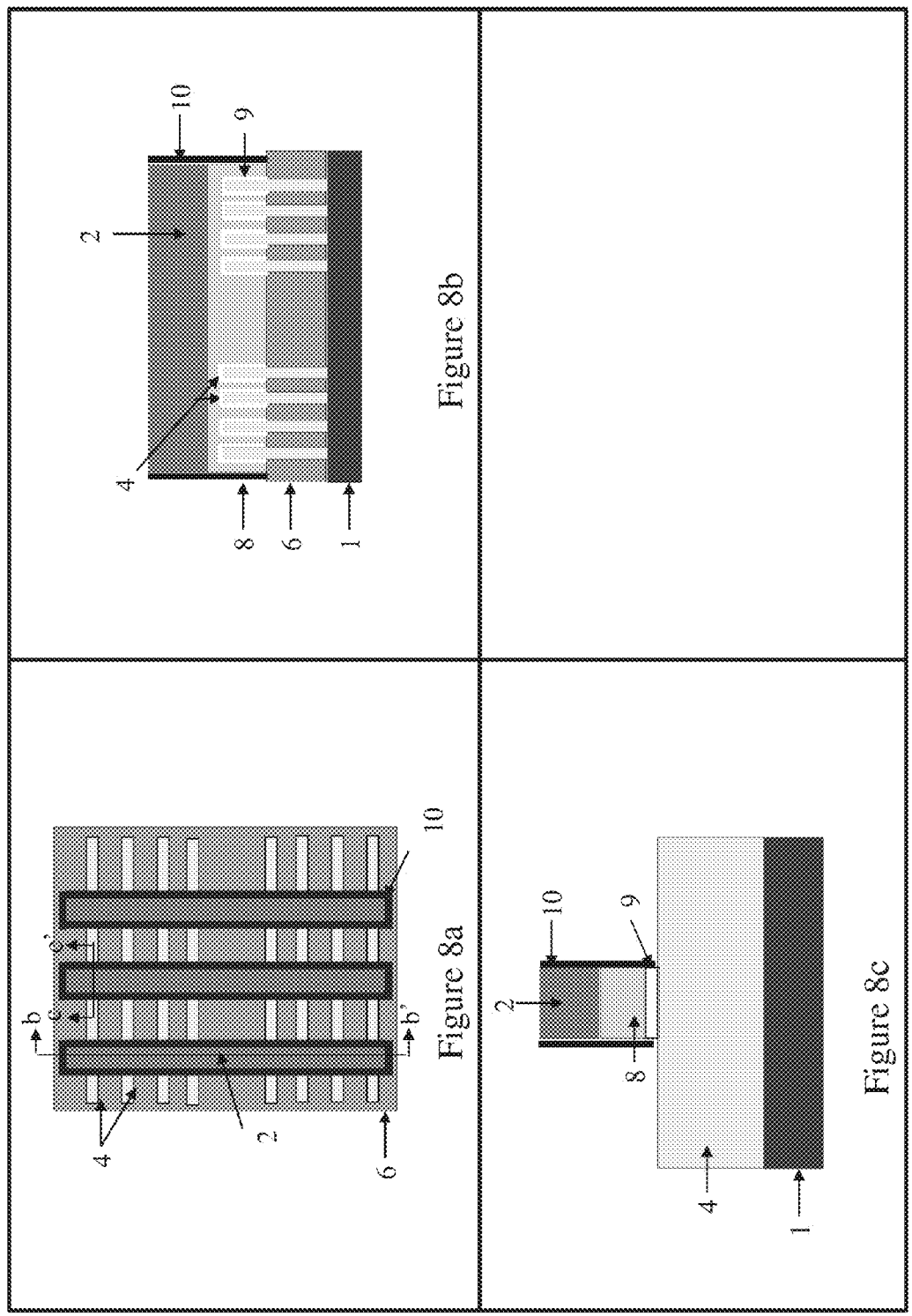

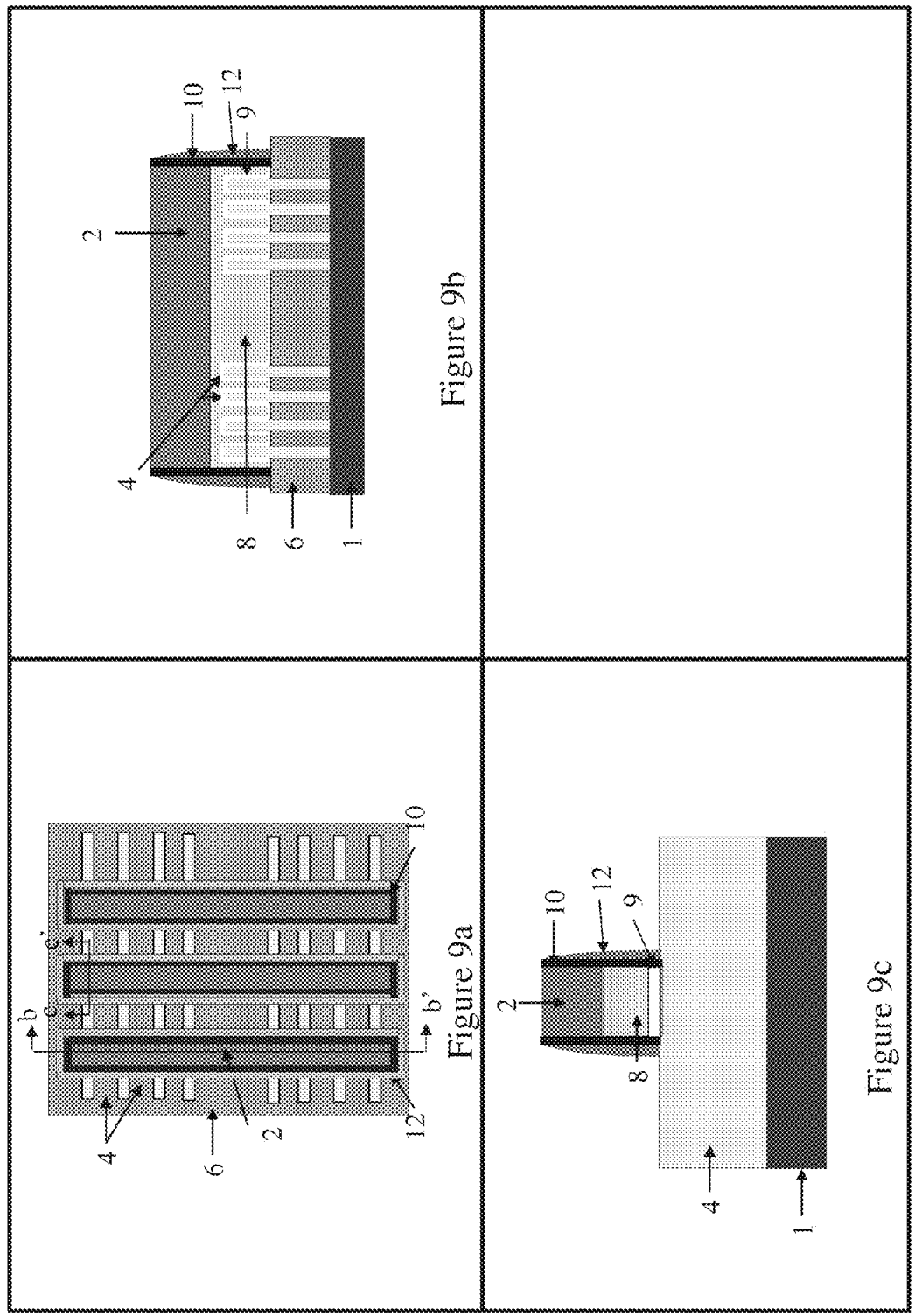

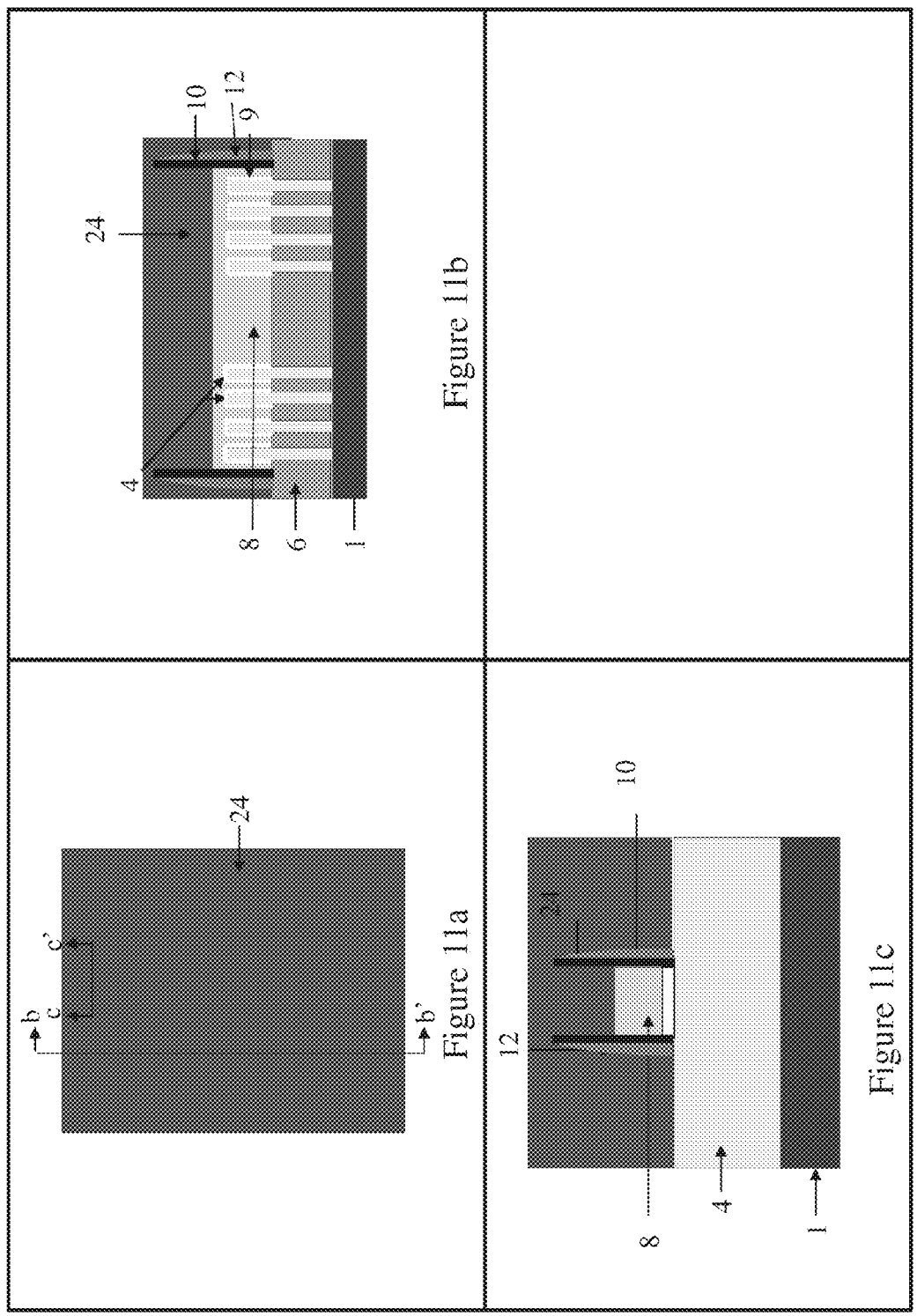

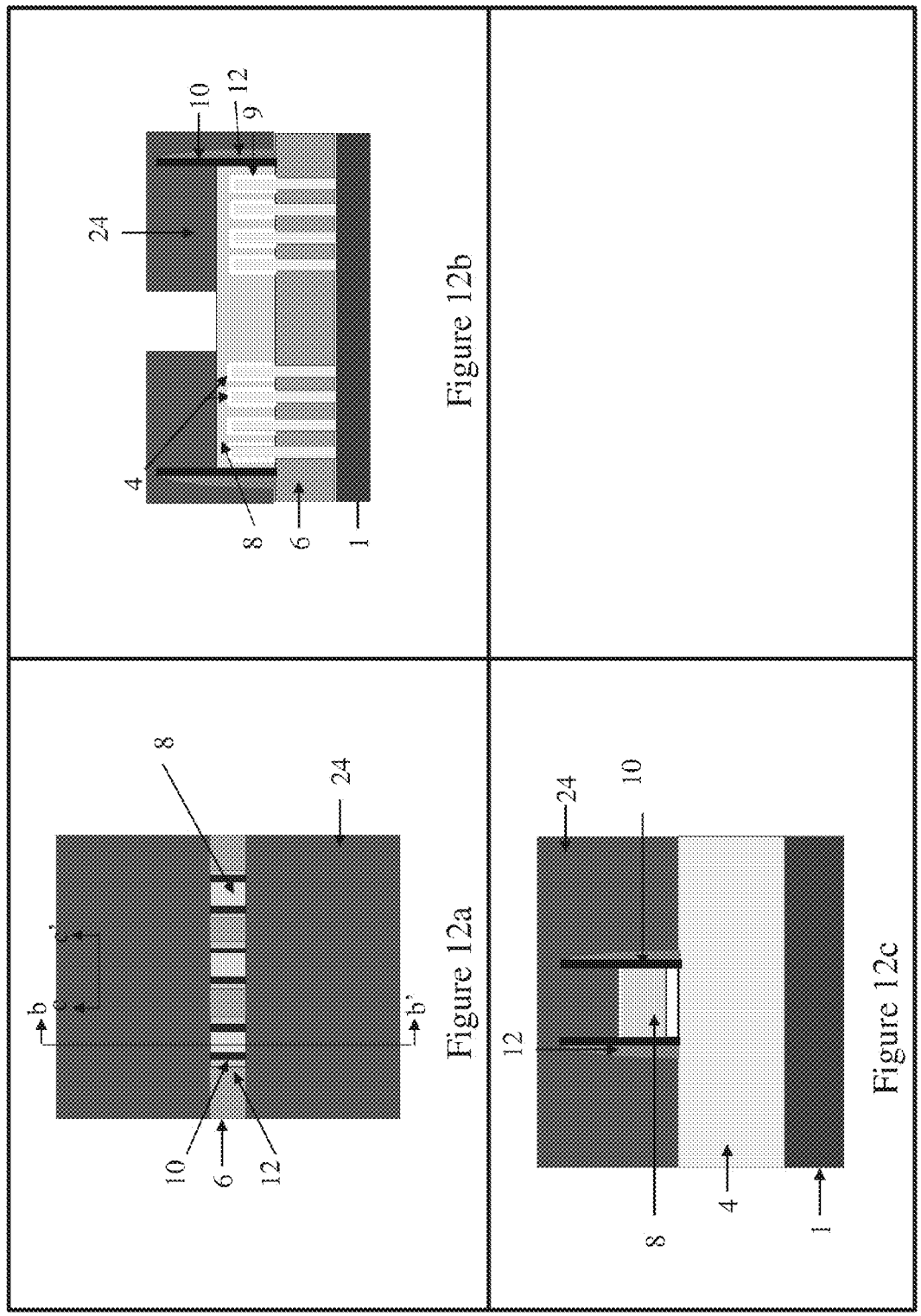

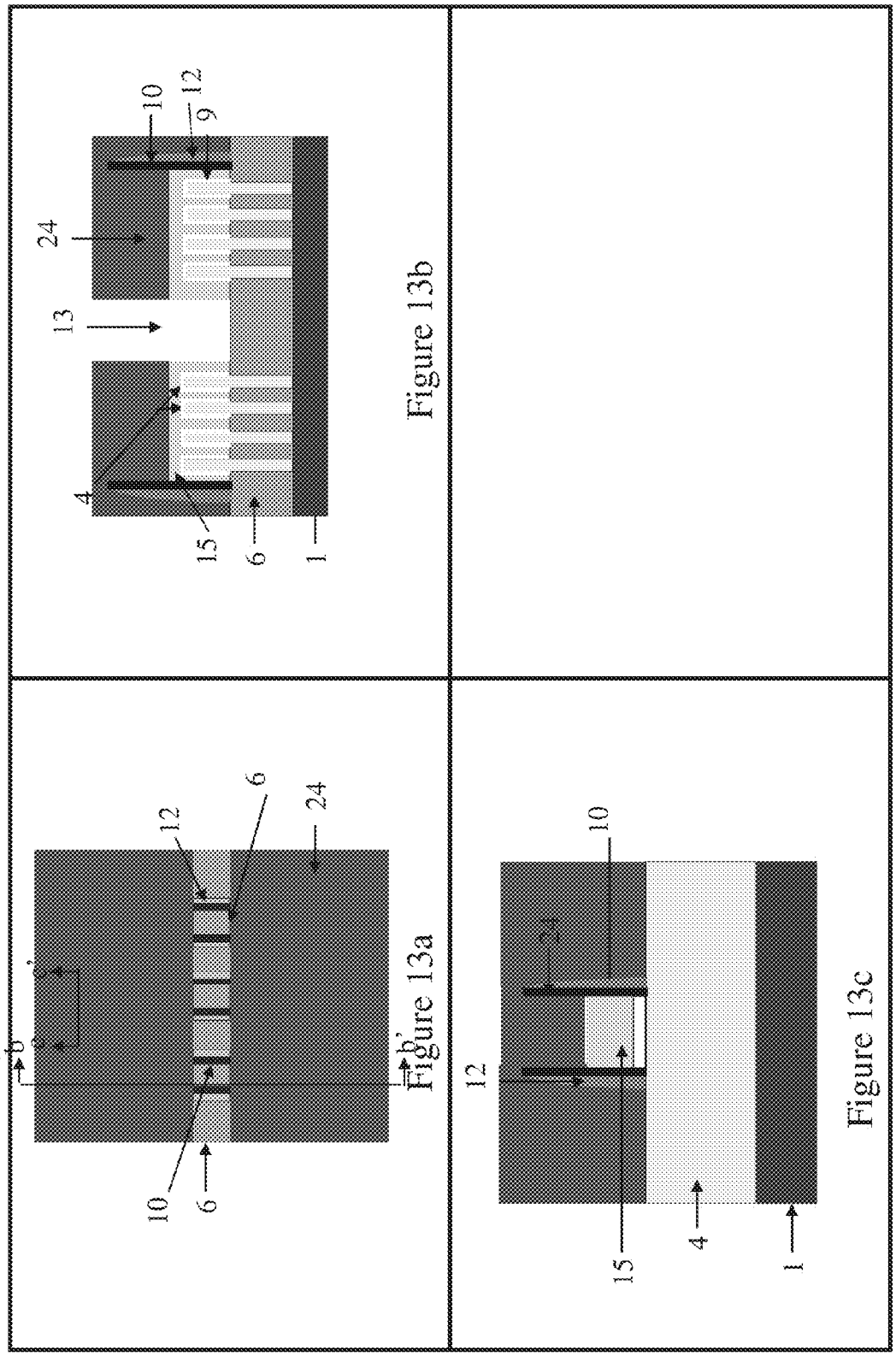

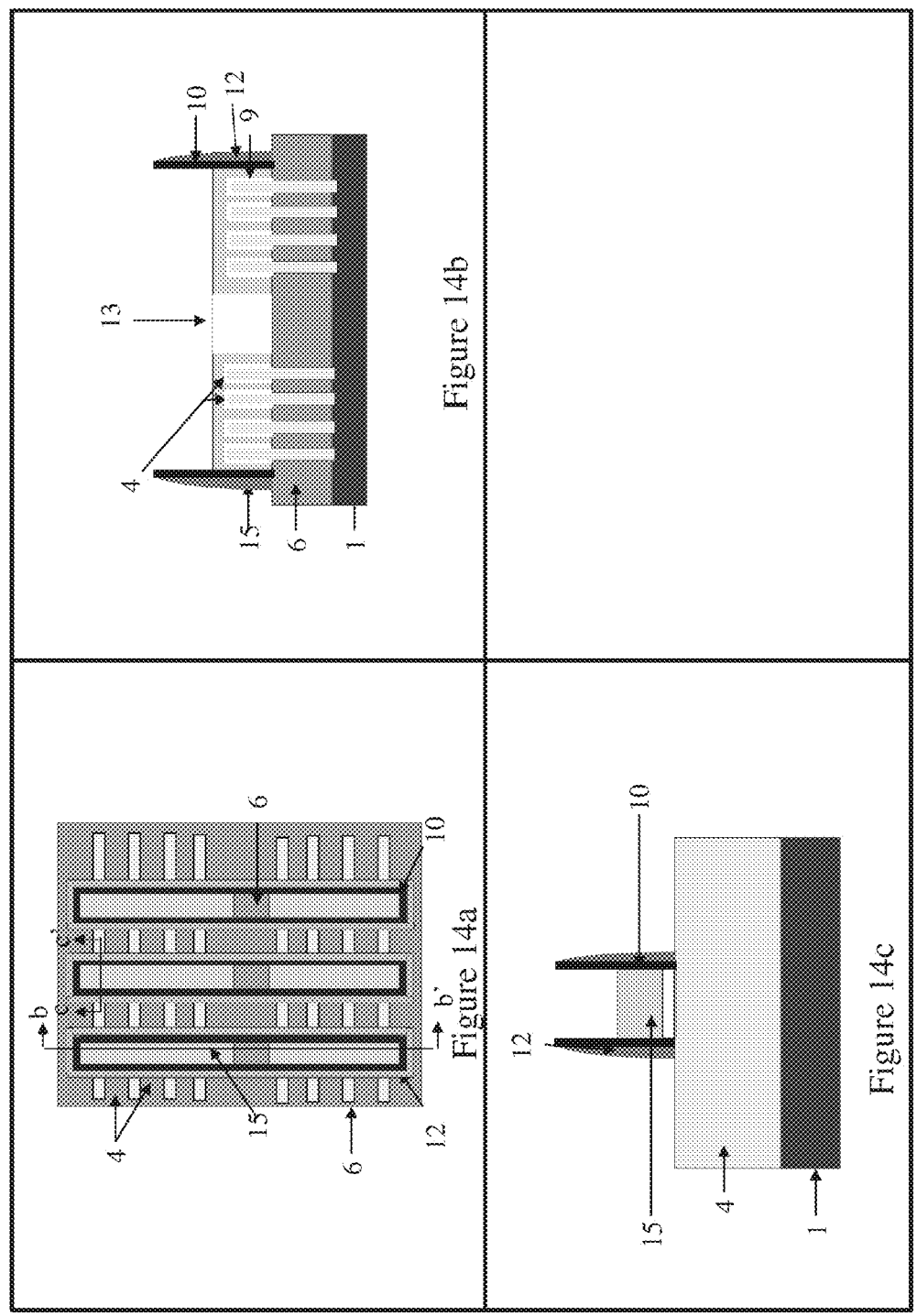

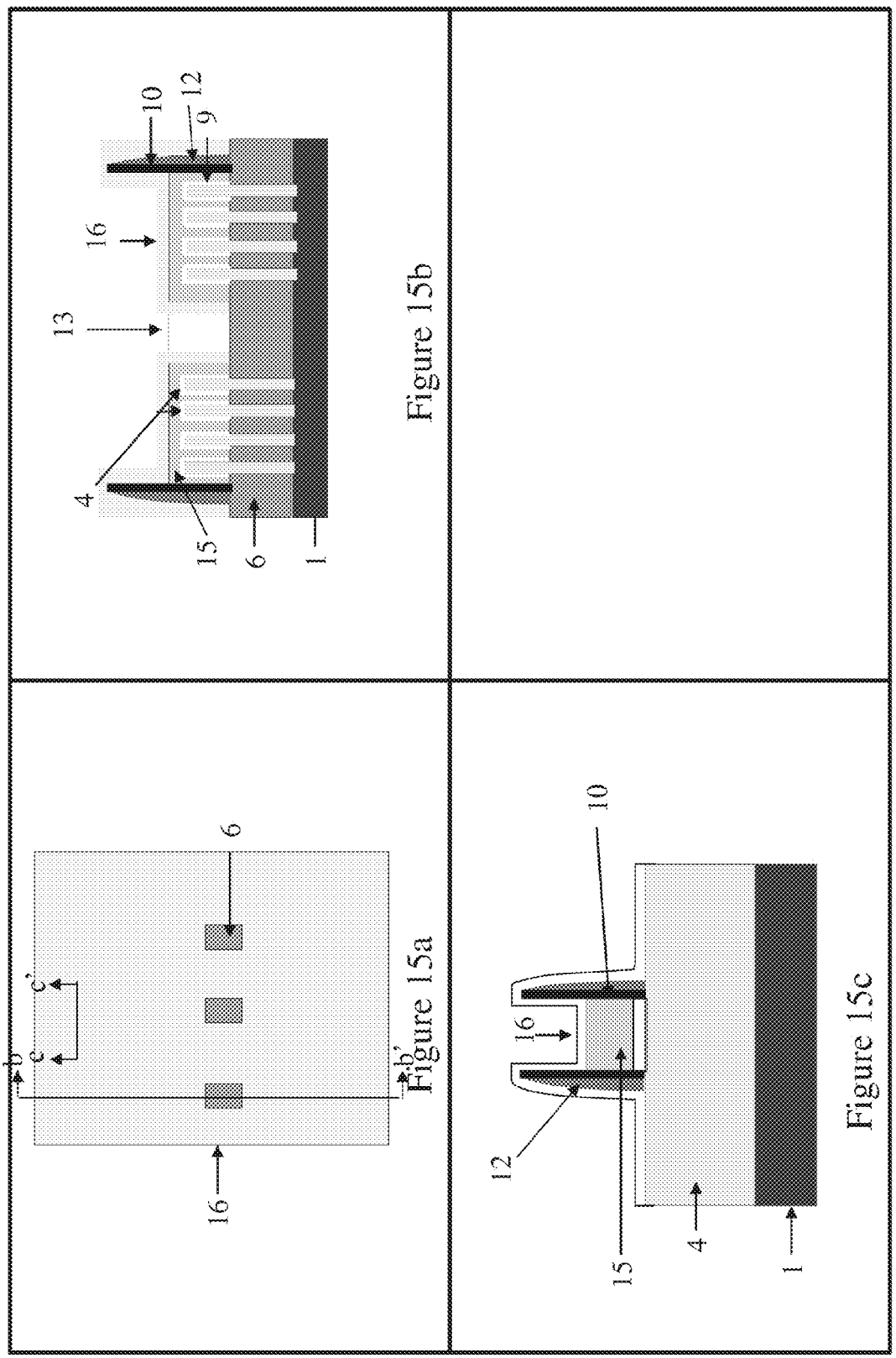

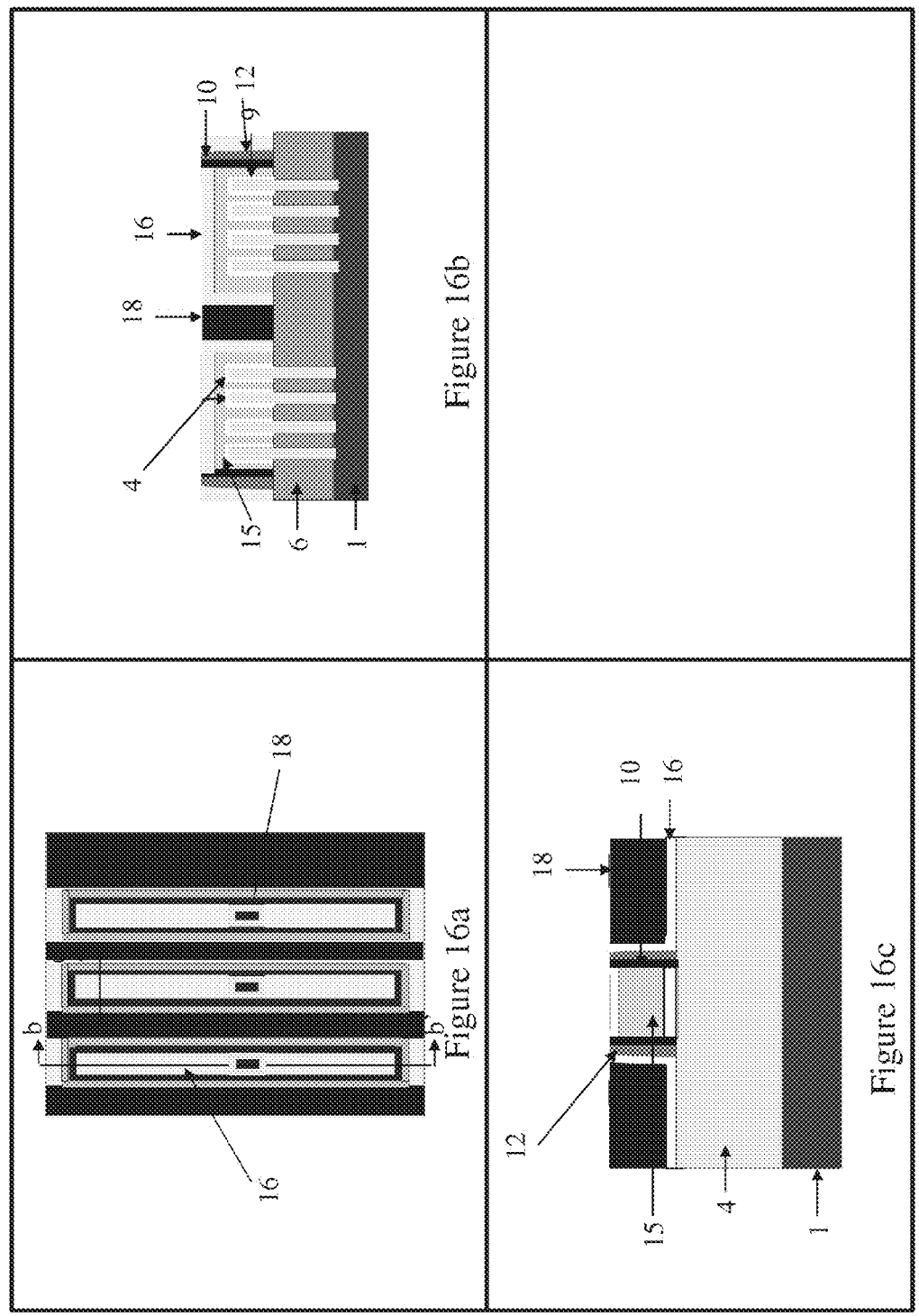

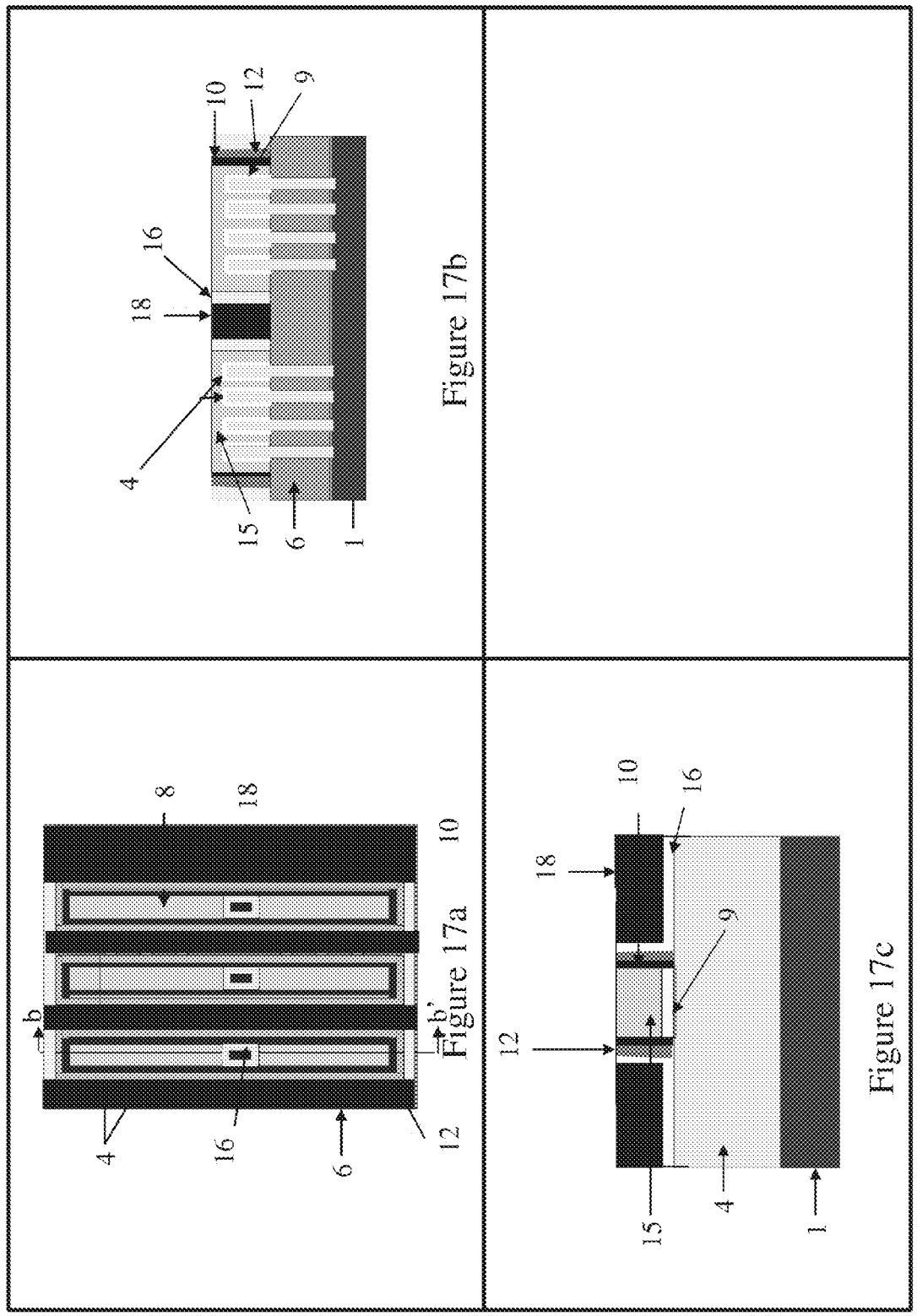

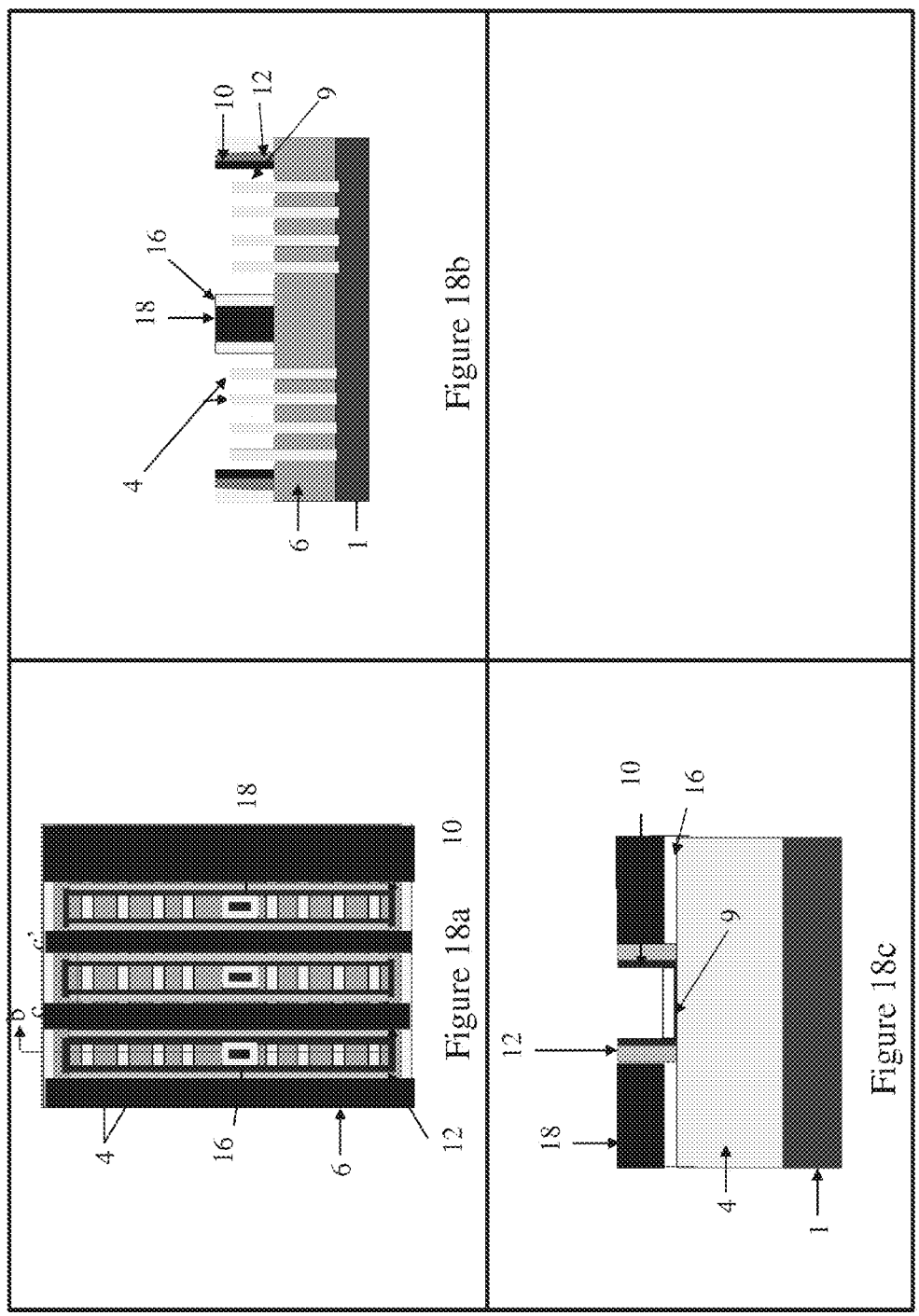

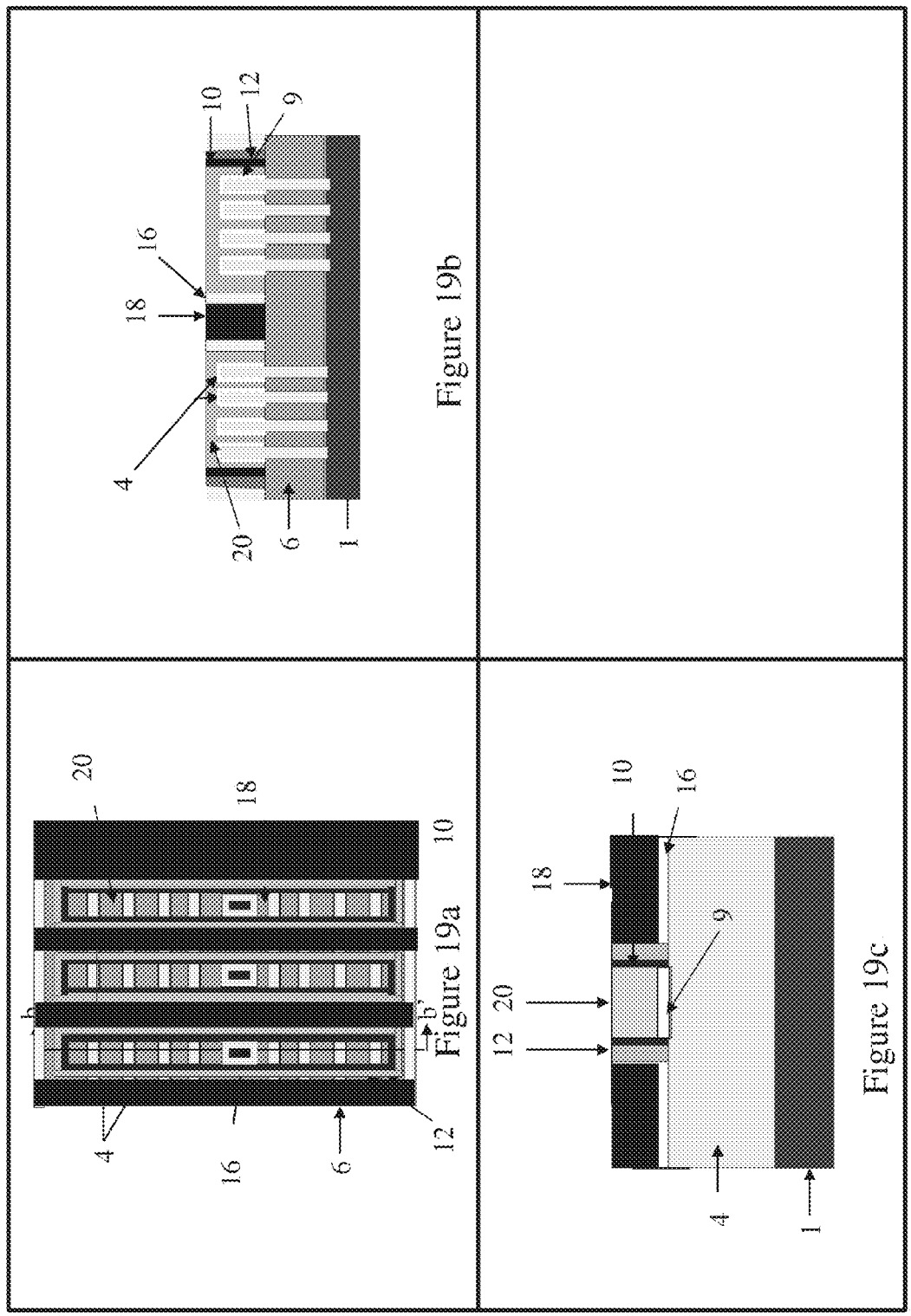

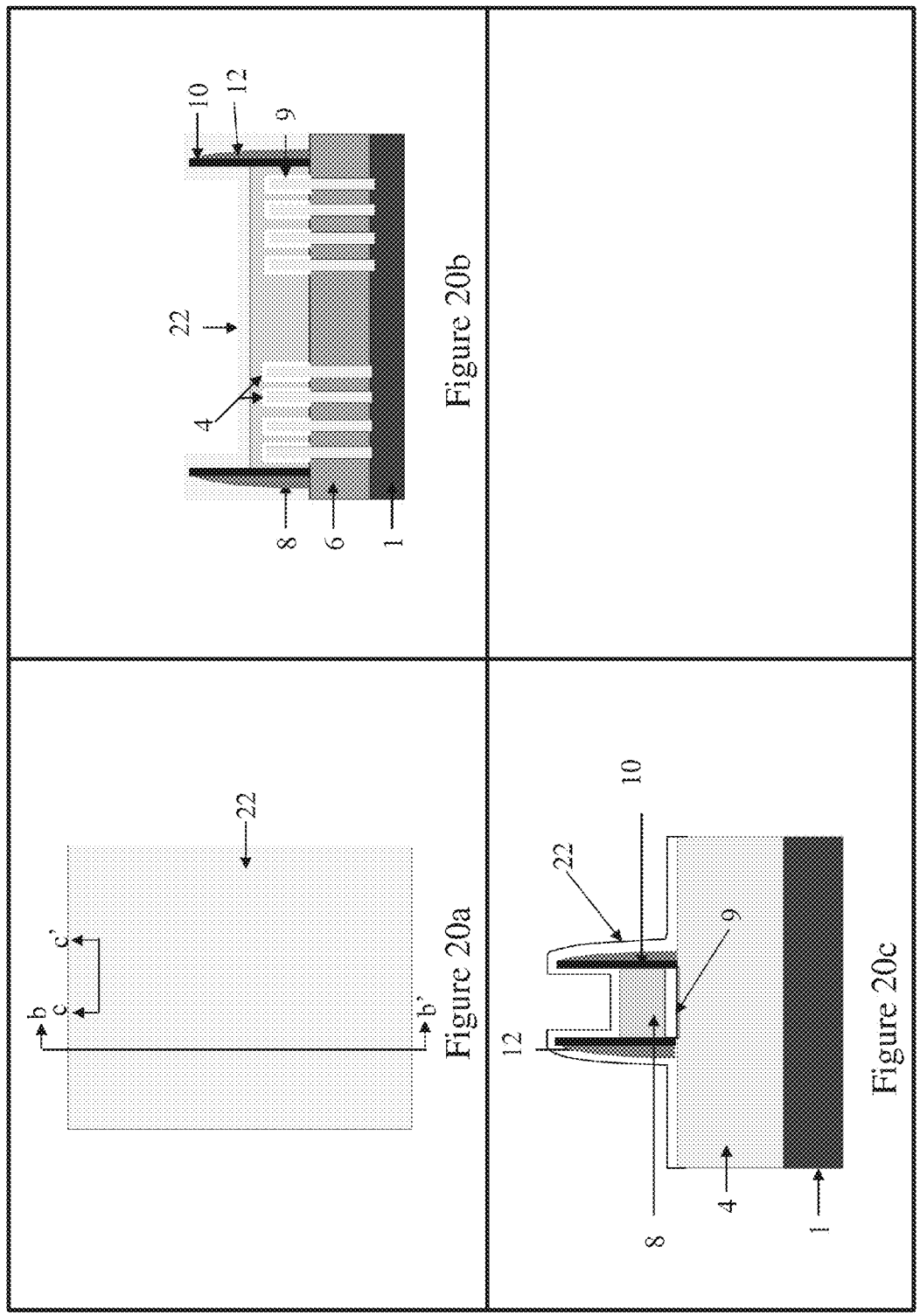

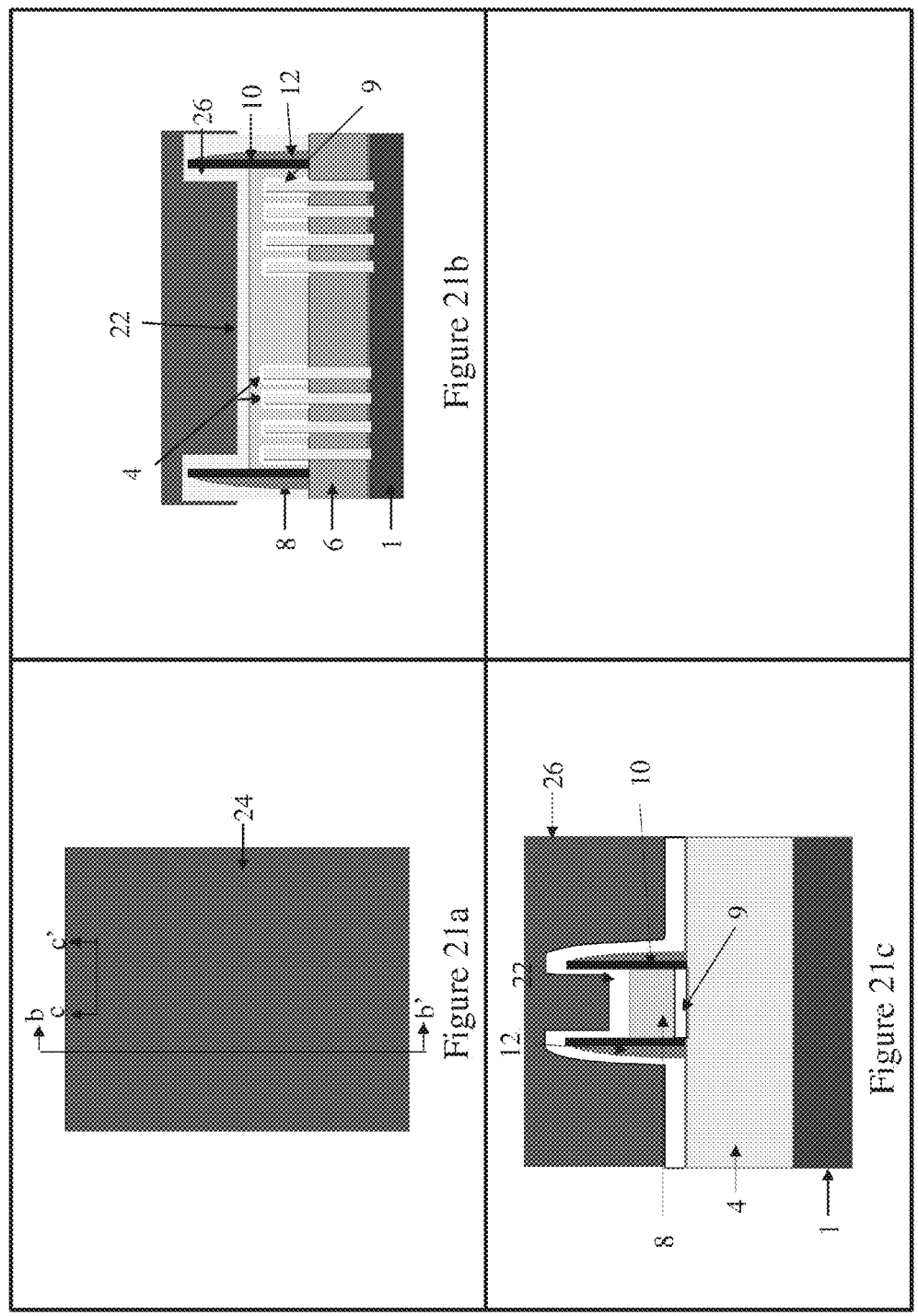

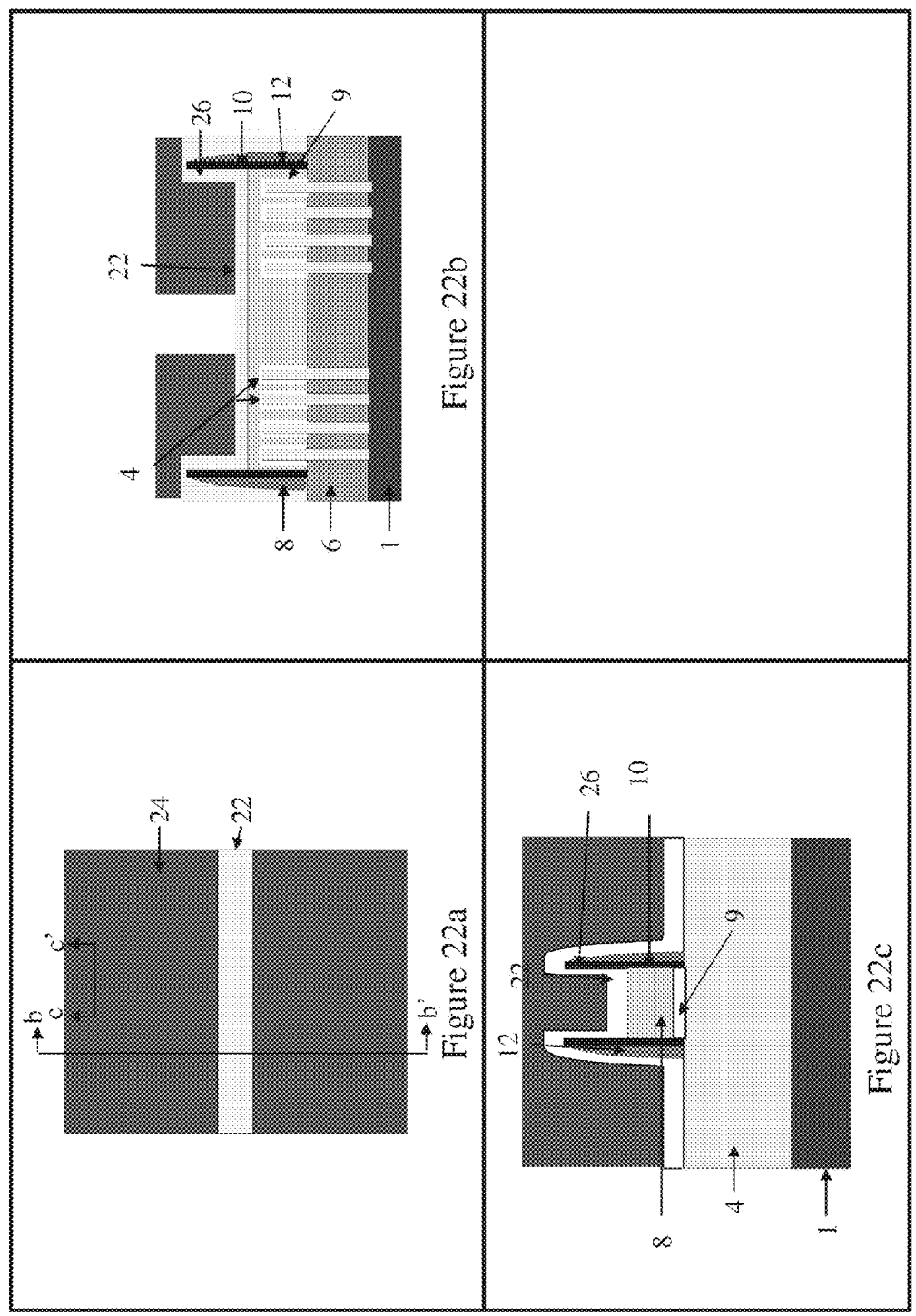

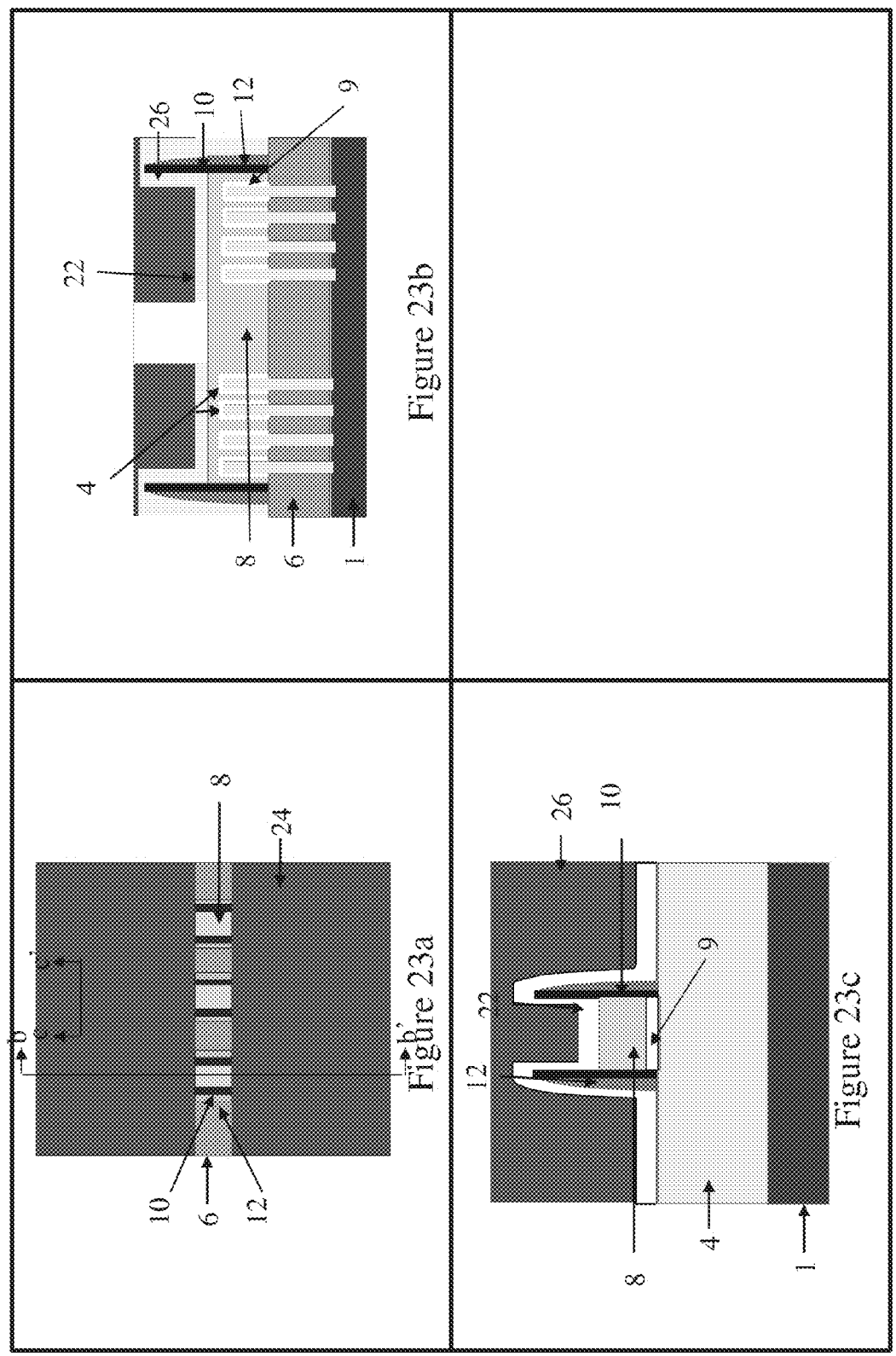

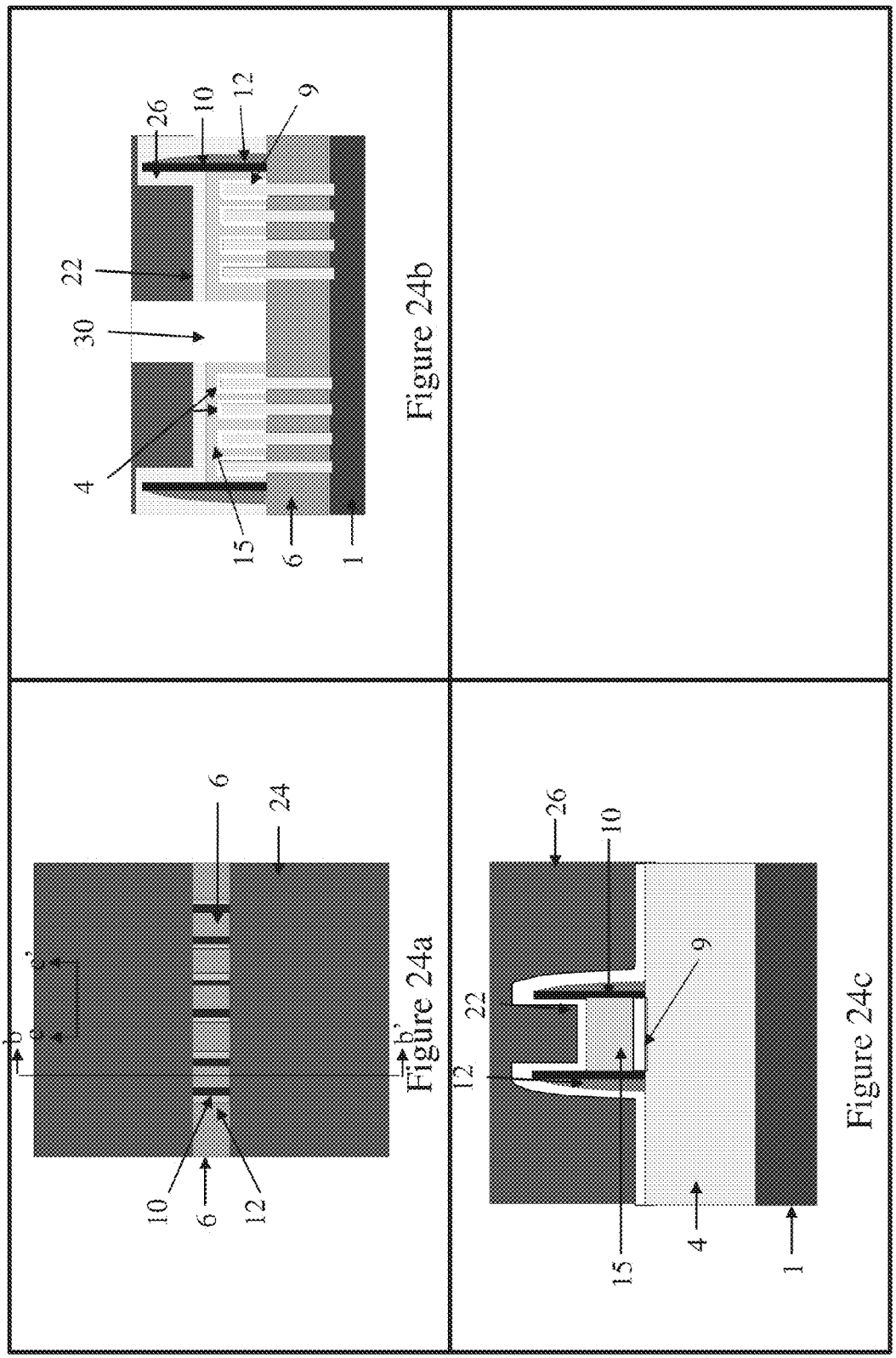

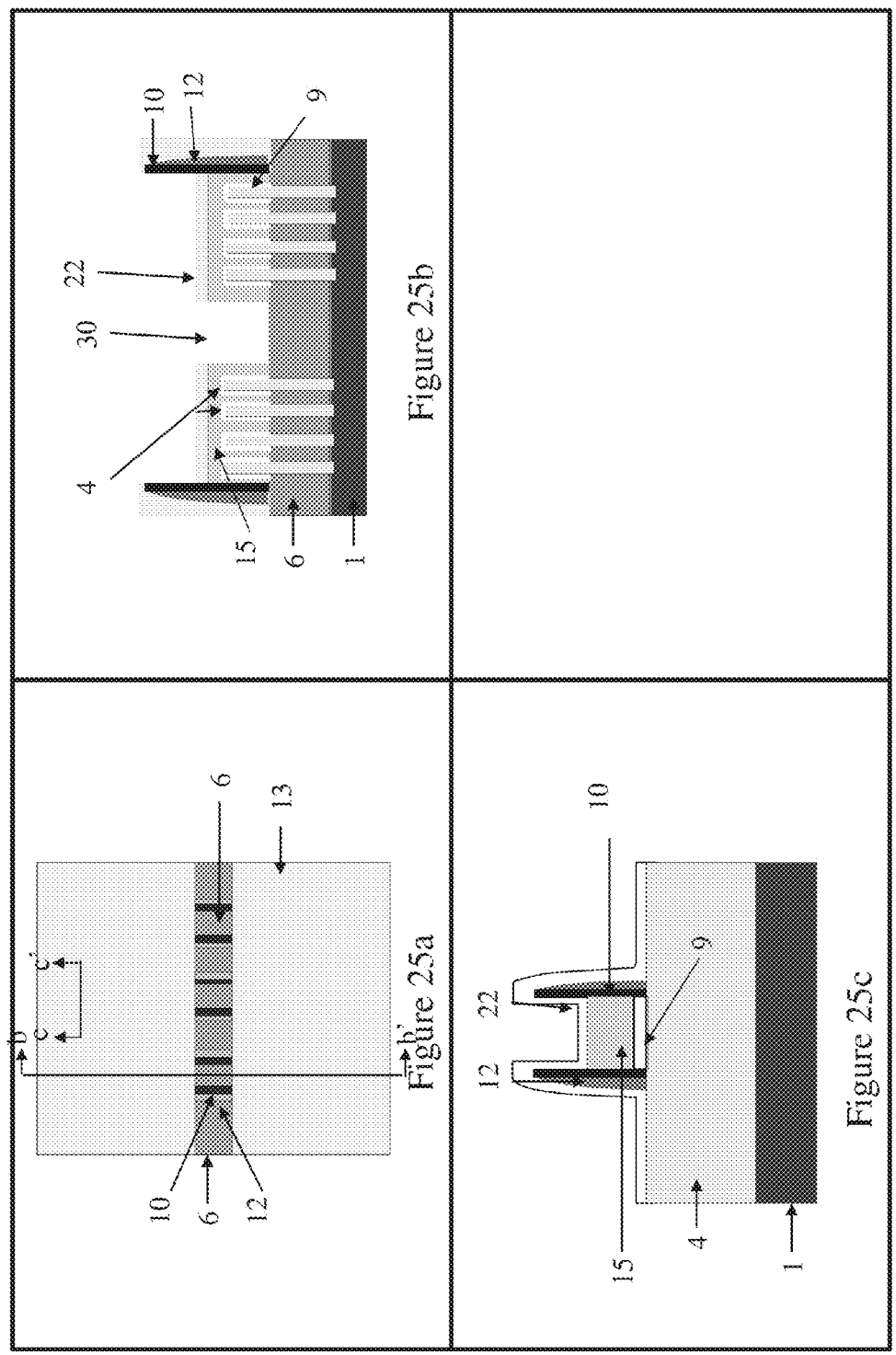

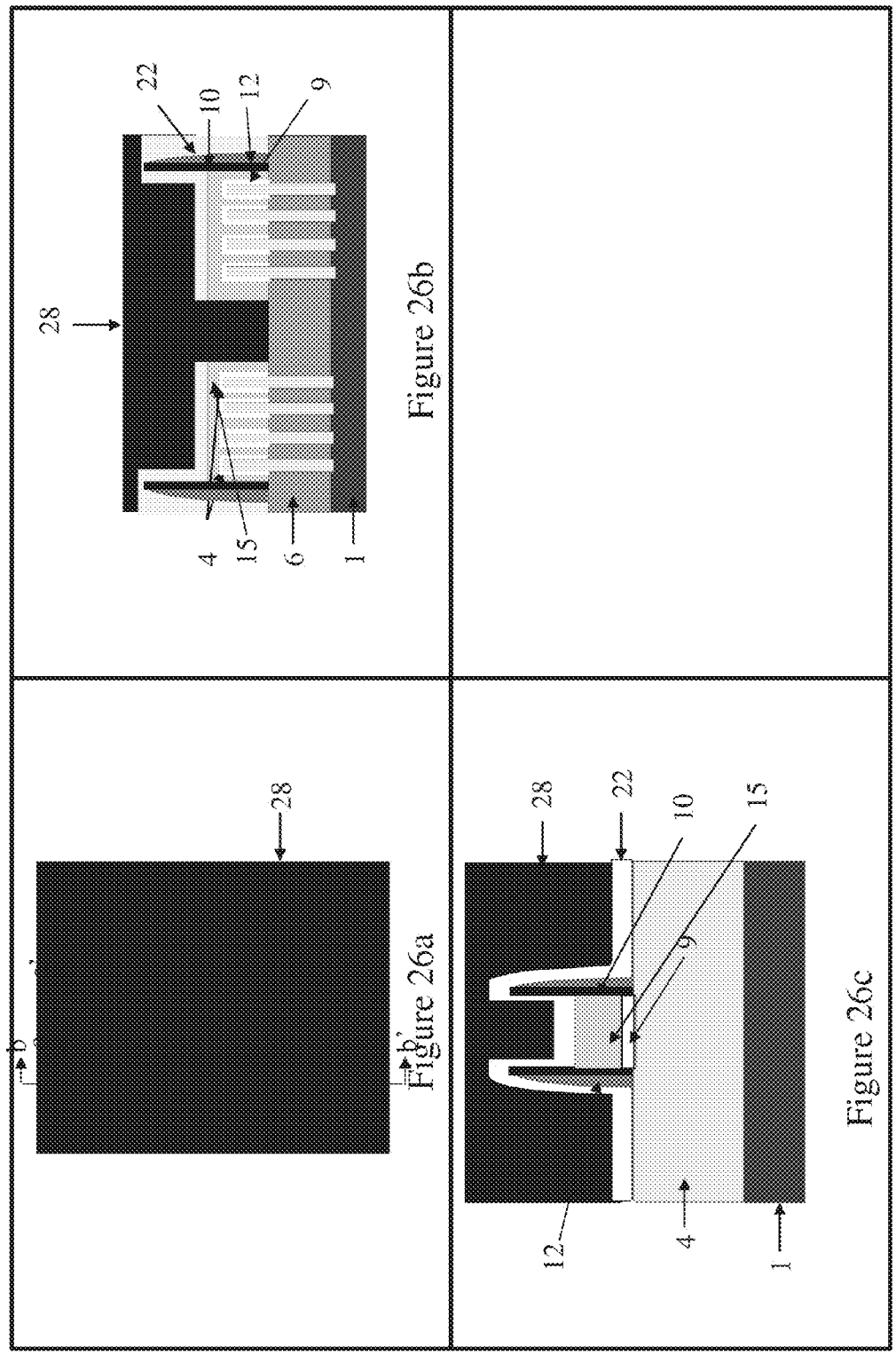

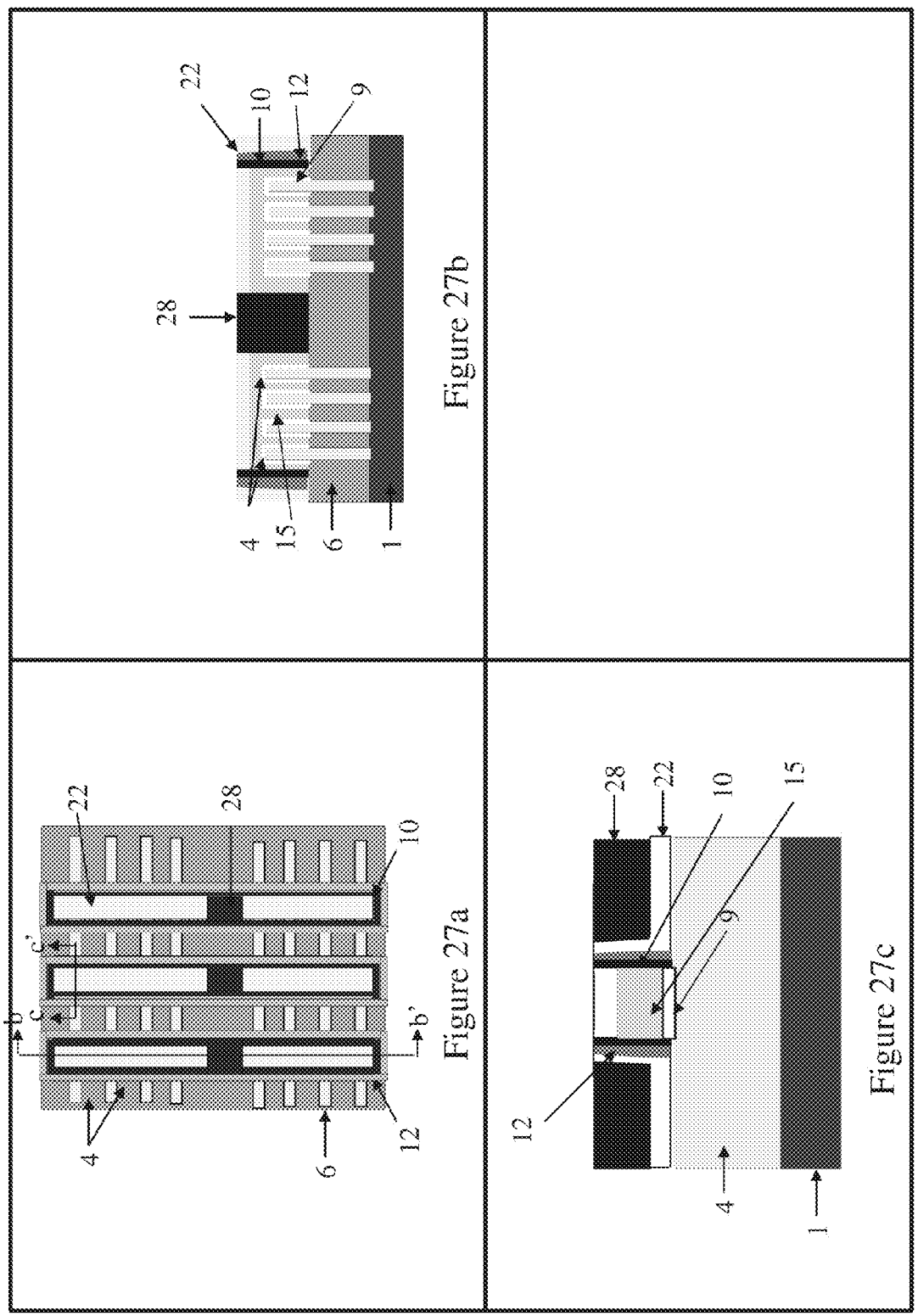

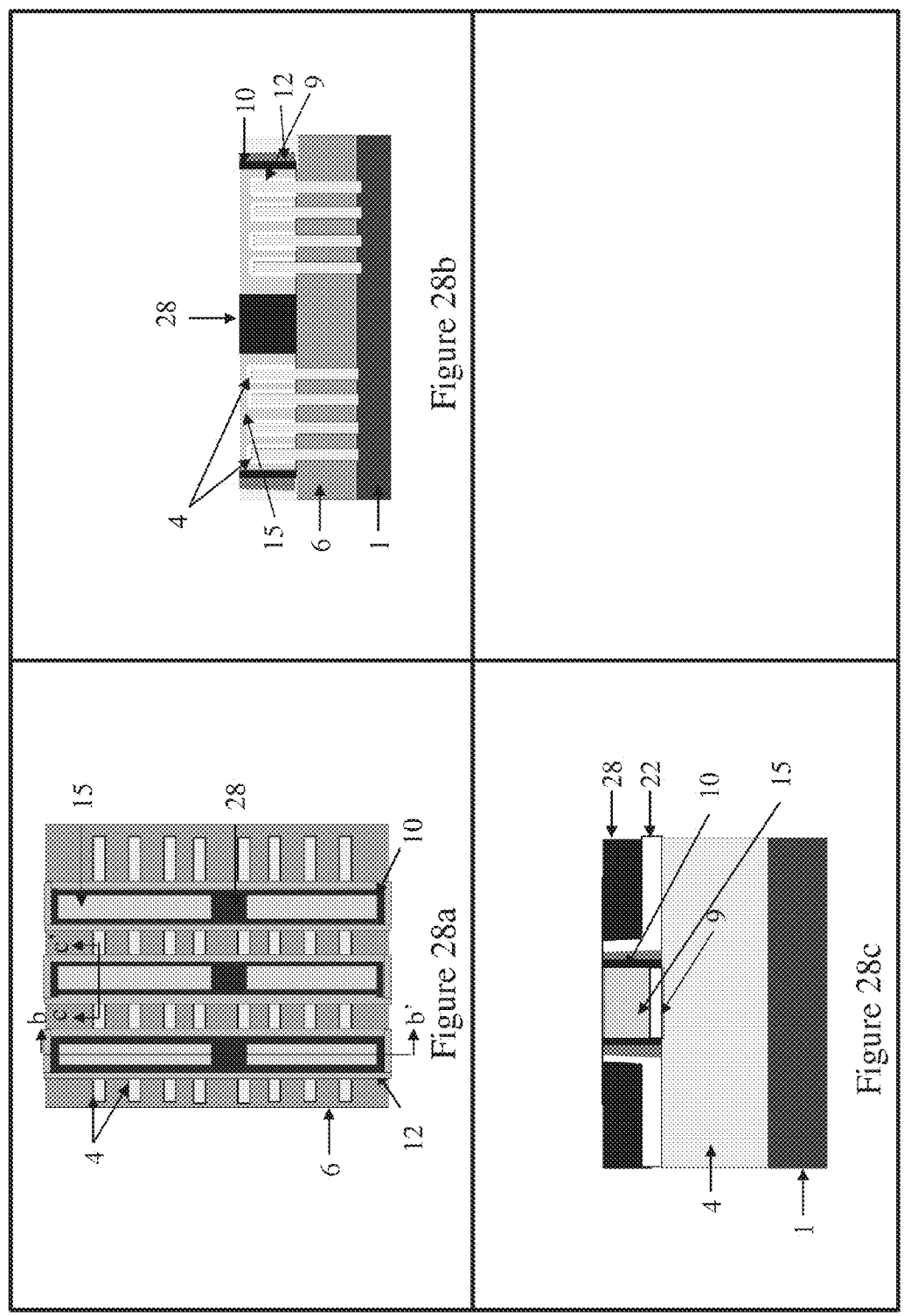

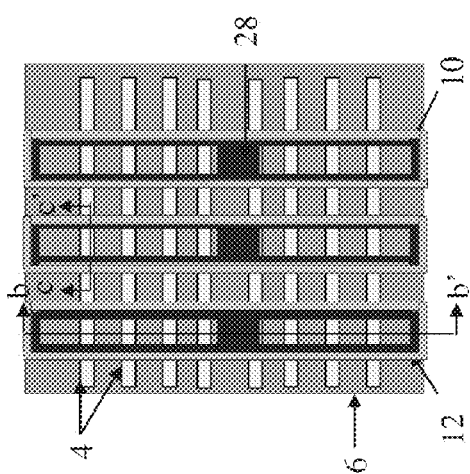
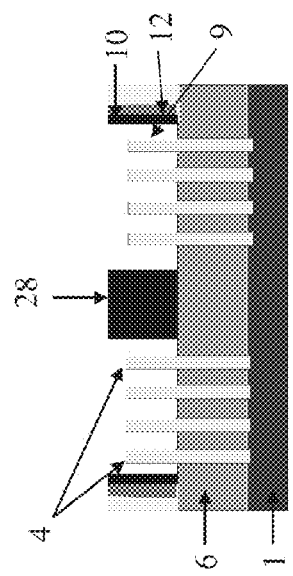
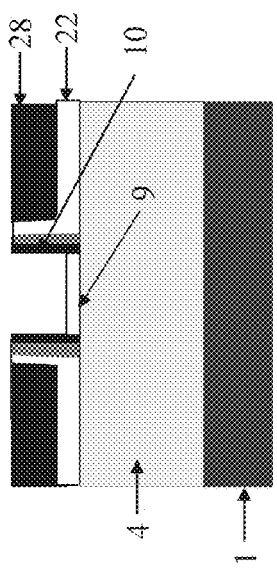

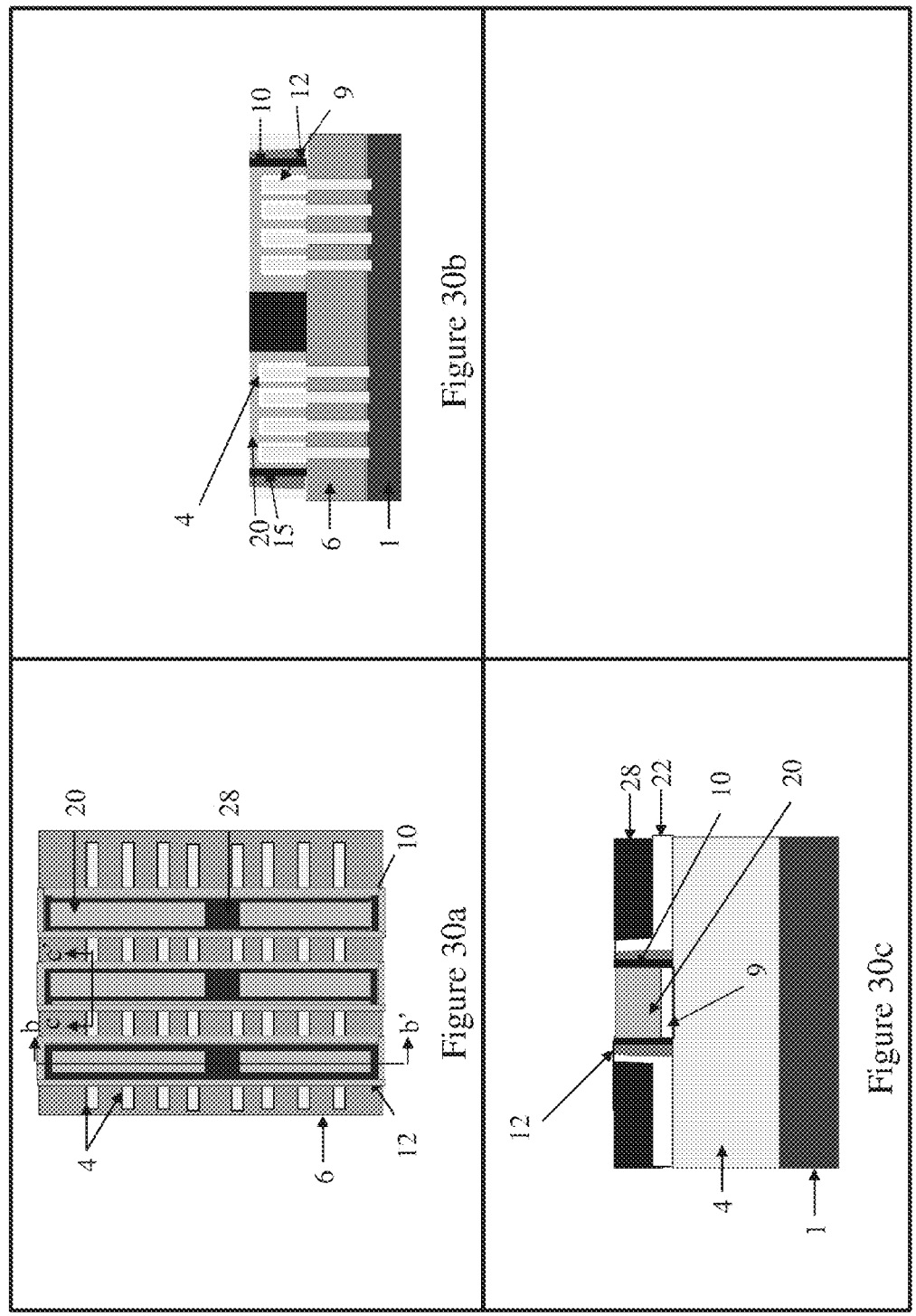

STRUCTURE AND METHOD FOR FABRICATING FIN DEVICES

This application is a continuation of U.S. patent application Ser. No. 13/335,479, filed on Dec. 22, 2011, and entitled "Structure and Method for Fabrication Fin Devices," which application is hereby incorporated herein by reference.

BACKGROUND

In the race to improve transistor performance as well as reduce the size of transistors, transistors have been developed that do not follow the traditional planar format, such that the source/drain regions are located in a fin above the substrate. One such non-planar device is a multiple-gate fin field effect transistor (FinFET). In its simplest form, a multiple-gate Fin-FET has a gate electrode that straddles across a fin-like silicon body to form a channel region. There are two gates, one on each sidewall of the silicon fin. The source/drain regions are also located in the fin on opposing sides of the channel region.

However, the fabrication of FinFETs can involve cutting the polysilicon line and removing a hard mask layer. The hard mask is used for a first etch process; while cutting the polysilicon line is a second etch process. Removing the hard mask layer after cutting the polysilicon line can lead to rounded polysilicon line edge profiles and rounded contact edge profiles, which in turn can lead to wider than desired process margins. Also, removing the hard mask layer after cutting the polysilicon line can lead to a mushroom defect.

Accordingly, what is needed is a fabrication process for fabricating FinFETs that allows for the removal of a hard mask layer before cutting the polysilicon line to prevent rounded polysilicon line edge profiles, rounded contact edge profiles, wide process margins, and mushroom defects.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2a through 2c are three views of the deposition of a hard mask in accordance with an embodiment;

FIGS. 3a through 3c are three views of the deposition of a photoresist layer in accordance with an embodiment;

FIGS. 4a through 4c are three views of a line pattern in a photoresist layer in accordance with an embodiment;

FIGS. 5a through 5c are three views of etching of a hard mask in accordance with an embodiment;

FIGS. 6a through 6c are three views of etching a polysilicon layer in accordance with an embodiment;

FIGS. 7a through 7c are three views of removing a photoresist layer in accordance with an embodiment;

FIGS. 8a through 8c are three views of forming a first spacer in accordance with an embodiment;

FIGS. 9a through 9c are three views of forming a second spacer in accordance with an embodiment;

FIGS. 11a through 11c are three views of deposition of a photoresist layer in accordance with an embodiment;

FIGS. 12a through 12c are three views of a cut polysilicon pattern in a photoresist layer in accordance with an embodiment;

FIGS. 13a through 13c are three views of etching a polysilicon layer in accordance with an embodiment;

FIGS. 14a through 14c are three views of the removal of a photoresist layer in accordance with an embodiment;

FIGS. 15a through 15c are three views of the deposition of a contact etch stop layer in accordance with an embodiment;

FIGS. 16a through 16c are three views of the deposition of an interlayer dielectric in accordance with an embodiment;

FIGS. 17a through 17c are three views of the removal of a contact etch stop layer in accordance with an embodiment;

FIGS. 18a through 18c are three views of the removal of a polysilicon layer in accordance with an embodiment;

FIGS. 19a through 19c are three views of the deposition of a metal layer in accordance with an embodiment;

FIGS. 20a through 20c are three views of the deposition of a contact etch stop layer in accordance with an embodiment;

FIGS. 21a through 21c are three views of the deposition of a photoresist layer in accordance with an embodiment;

FIGS. 22a through 22c are three views of a cut polysilicon pattern in a photoresist layer in accordance with an embodiment;

FIGS. 23a through 23c are three views of etching a contact etch stop layer in accordance with an embodiment;

FIGS. 24a through 24c are three views of etching a polysilicon layer in accordance with an embodiment;

FIGS. 25a through 25c are three views of the removal of a photoresist layer in accordance with an embodiment;

FIGS. 26a through 26c are three views of the deposition of an interlayer dielectric in accordance with an embodiment;

FIGS. 27a through 27c are three views of the partial removal of an interlayer dielectric in accordance with an embodiment;

FIGS. 28a through 28c are three views of the removal of a contact etch stop layer in accordance with an embodiment;

FIGS. 29a through 29c are three views of the removal of a polysilicon layer in accordance with an embodiment;

FIGS. 30a through 30c are three views of the deposition of a metal layer in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a structure and method for manufacturing a FinFET device. The embodiments may also be applied, however, to other semiconductor manufacturing processes.

Various steps of a first embodiment are illustrated and discussed below with reference to FIGS. 1a through 19c. Various steps of a second embodiment are illustrated and discussed below with reference to FIGS. 20a through 30c.

Where appropriate, like or analogous elements are referenced with a common numeral in FIGS. 1a through 30c. Each of FIGS. 1a through 30c contain three sub-figures labeled a, b and c (FIG. 1a, FIG. 1b, FIG. 1c, ..., FIG. 30a, FIG. 30b, FIG. 30c). Within each of FIGS. 1a through 30c, subfigure a illustrates a top view of a given fabrication step, subfigure b illustrates a cross sectional view along line b-b' of the same step, and subfigure c illustrates a cross sectional view along line c-c' of the same step.

Figure 1A:
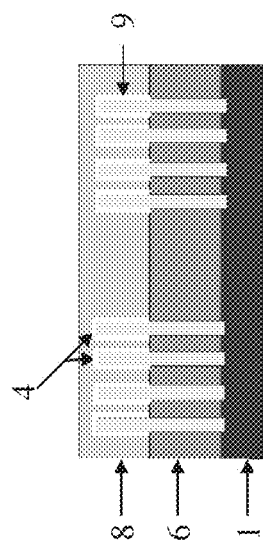
FIGS. 1a through 1c are three views of fin structures with a shallow trench isolation layer and a polysilicon layer on a substrate in accordance with an embodiment.
Figure 1B:
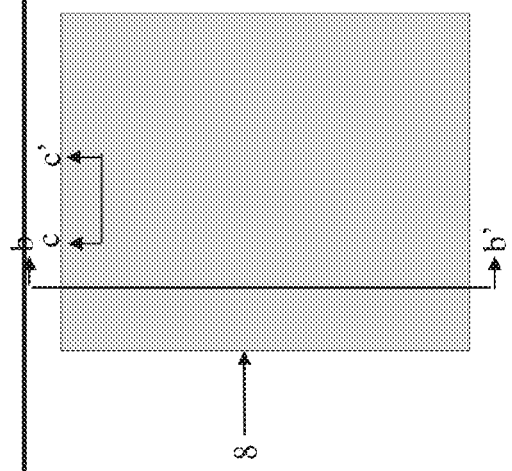
Figure 1C:
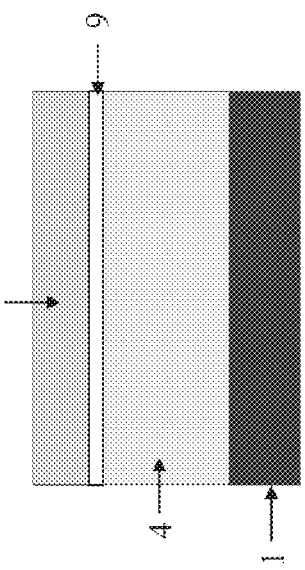

A first embodiment will be discussed with reference to FIGS. 1a through 19c, in which FIGS. 1a-1c illustrate a substrate 1 with fins 4, shallow trench isolations (STIs) 6, a gate dielectric 9, and a gate electrode layer 8 formed thereon. The substrate 1 may be a silicon substrate, although other substrates, such as semiconductor-on-insulator (SOI), strained SOI, and silicon germanium on insulator, could alternatively be used. The substrate 1 may be a p-type semiconductor, although in other embodiments, it could alternatively be an n-type semiconductor.

The fins 4 may be formed on the substrate 1 and may be used to form FinFET transistors. FIGS. 1a-1c illustrate eight fins 4 formed on the substrate 1, but any number of fins 4 may alternatively be utilized. The fins 4 may be formed by initially forming a layer of semiconductor material (not individually illustrated in FIGS. 1a-1c) and depositing a mask material (also not individually shown in FIGS. 1a-1c) such as a photoresist material and/or a hard mask over the layer of semiconductor material. Once the mask material has been formed over the layer of semiconductor material, the mask material may then be patterned, and the semiconductor layer may be etched in accordance with the pattern in order to form the fins 4.

However, as one of ordinary skill in the art will recognize, the above described process for forming the fins 4 on the substrate 1 is merely one illustrative embodiment and is not intended to limit the embodiments in any fashion. Any suitable method of forming the fins 4 may alternatively be utilized. For example, in an embodiment in which the substrate 1 is a silicon-on-insulator substrate formed of a first semiconductor layer, a layer of insulator over the first semiconductor layer, and a second semiconductor layer over the layer of insulator, the second semiconductor layer may be patterned into the fins 4 (using, e.g., a masking and etching process) without the deposition of additional semiconductor material. This and all other suitable methods form manufacturing the fins 4 are fully intended to be included within the scope of the embodiments.

STIs 6 may be formed on the substrate 1 between the fins 4. The STIs 6 may be composed of a dielectric material such as a high density plasma (HDP) oxide, tetraethyl orthosilicate (TEOS), an oxide material such as SiO, a nitride material such as SiN, combinations of these, or the like. The STIs 6 may be formed using a chemical vapor deposition (CVD) process such as the HARP process, a high density plasma CVD method, or other suitable method of formation as is known in the art. The trenches may be filled, and any excess material outside the trenches may be removed by a suitable process.

The gate dielectric 9 may be formed on the fins 4 in order to act as a gate dielectric for transistors to be formed in the fins 4. In an embodiment the gate dielectric 9 may be formed by thermal oxidation, chemical vapor deposition, sputtering, or any other methods known and used in the art for forming a gate dielectric. Depending on the technique of gate dielectric formation, the gate dielectric 9 thickness on a top of the fin 4 may be different from the gate dielectric thickness on a sidewall of the fin 4.

The gate dielectric 9 may comprise a material such as silicon dioxide or silicon oxynitride with a thickness ranging from about 3 angstroms to about 100 angstroms, such as less than about 10 angstroms. The gate dielectric 9 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 3 angstroms to about 100 angstroms, such as 10 angstroms or less.

The gate electrode layer 8 may be formed over the gate dielectric 9 and the fins 4 to act as a gate electrode for the transistors to be formed in the fins 4. In an embodiment the gate electrode layer 8 may comprise a first conductive material 11 selected from a group comprising of polycrystalline-silicon (poly-Si), poly-crystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode layer 8 may be deposited by chemical vapor deposition (CVD), sputter deposition, or other techniques suitable for depositing conductive materials. The thickness of the gate electrode layer 8 may be in the range of about 200 angstroms to about 4,000 angstroms. The top surface of the gate electrode layer 8 may have a non-planar top surface, and may be planarized prior to patterning of the gate electrode layer 8 or gate etch. Ions may or may not be introduced into the gate electrode layer 8 at this point. Ions may be introduced, for example, by ion implantation techniques.

FIGS. 2a-2c illustrate a hard mask 2 deposited on the gate electrode layer 8. The hard mask 2 may be composed of an oxide, which may be silicon oxide, silicon oxynitride, silicon nitrate or a combination thereof. An oxide layer of hard mask 2 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. The hard mask 2 may also be formed, for example, by an in-situ steam generation (ISSG) process in an ambient environment of $O_2$, $H_2O$, NO, a combination thereof, or the like. The hard mask 2 may be formed to a thickness of between about 100 Å and about 2,000 Å, such as about 1,000 Å.

Alternatively, the hard mask 2 may be a composite mask, and may comprise both an oxide layer and a nitride layer. In this embodiment the oxide layer may be formed as described above, and the nitride layer may be formed using CVD techniques using silane and ammonia as precursor gasses, and deposition temperatures ranging from 550° Celsius to 900° Celsius. The nitride layer of hard mask 2 may be from about 300 Å to about 800 Å thick.

In FIGS. 3a-3c, a first photoresist 14 may be deposited on the hard mask 2. The first photoresist 14 may comprises a conventional photoresist material, such as a deep ultra-violet (DUV) photoresist, and may be deposited on the surface of the hard mask 2, for example, by using a spin-on process to place the first photoresist 14. However, any other suitable material or method of forming or placing the first photoresist 14 may alternatively be utilized.

FIGS. 4a-4c illustrate a patterning of the first photoresist 14. In an embodiment the first photoresist 14 may be exposed to energy, e.g. light, through a patterned reticle in order to induce a reaction in those portions of the first photoresist 14 exposed to the light. The first photoresist 14 may then be developed, and portions of the first photoresist 14 may be removed, leaving a line pattern in the first photoresist 14.

FIGS. 5a-5c depict a transfer of the line pattern from the first photoresist 14 to the hard mask 2. In an embodiment this transfer may be performed by etching the hard mask 2 while the first photoresist 14 protects those areas of the hard mask 2 which are not desired to be removed. The etching may be, for example, a dry etch with etchants such as $NH_3/NF_3$, chemical oxide removal, or the like in order to transfer the pattern of the first photoresist 14 to the hard mask 2. However, any other suitable process to transfer the pattern of the first photoresist 14 to the hard mask 2 may alternatively be utilized.

FIGS. 6a-6c illustrate the transfer of the line pattern in the hard mask 2 to the gate electrode layer 8 and the gate dielectric 9. In an embodiment this transfer may be performed by etching the gate electrode layer 8 and the gate dielectric 9 with the hard mask 2 in place in order to protect the underlying gate electrode layer 8 and the gate dielectric 9. The etching process to transfer the pattern from the hard mask 2 to the gate electrode layer 8 and the gate dielectric 9 may be a dry etch, such as a reactive ion etch (RIE), although any suitable etching process may alternatively be utilized.

FIGS. 7a-7c illustrate the removal of the first photoresist 14 from over the hard mask 2. In an embodiment the first photoresist 14 may be removed using a process such as ashing, whereby the temperature of the first photoresist 14 is increased until the first photoresist 14 decomposes and may be removed. However, the embodiments are not intended to be limited to ashing, as any other suitable process may alternatively be utilized to remove the first photoresist 14.

FIGS. 8a-8c illustrate that a first spacer 10 may be formed adjacent to the gate electrode layer 8 and the gate dielectric 9. The first spacer 10 may comprise SiN, oxynitride, SiC, SiON, oxide, and the like. The first spacer 10 may be formed on opposing sides of the gate electrode layer 8 and the gate dielectric 9. The first spacer 10 may be formed by blanket depositing a spacer layer (not shown) on the previously formed structure using a process such as chemical vapor deposition (CVD), plasma enhanced CVD, or other methods known in the art. The first spacer 10 may then be patterned, such as by anisotropically etching, to remove the spacer layer from the horizontal surfaces of the structure.

FIGS. 9a-9c illustrate that a second spacer 12 may be formed next to the first spacer 10. The second spacer 12 may, similar to the first spacer 10, comprise SiN, oxynitride, SiC, SiON, oxide, and the like. The second spacer 12, similar to the first spacer 10, may be formed by blanket depositing a spacer layer (not shown) on the previously formed structure using a process such as chemical vapor deposition (CVD), plasma enhanced CVD, and other methods known in the art. The second spacer 12 may then be patterned, such as by anisotropically etching to remove the spacer layer from the horizontal surfaces of the structure.

Figure 10B:
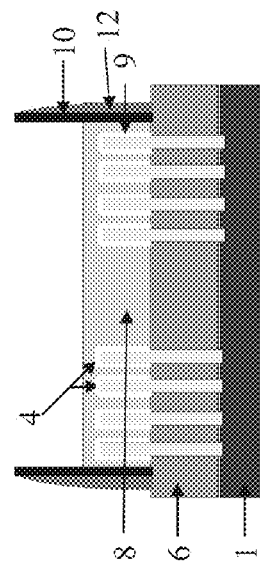
FIGS. 10a through 10c are three views of the removal of a hard mask in accordance with an embodiment.
Figure 10A:
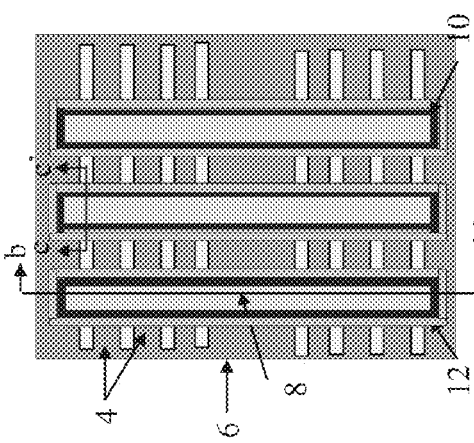
Figure 10C:
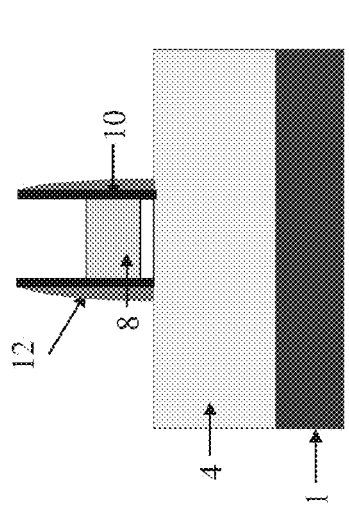

FIGS. 10a-10c illustrate a removal of the hard mask 2 from the gate electrode layer 8. The hard mask 2 may be removed by a wet etch process or by a dry etch process that uses an etchant that has a suitable selectivity to the hard mask 2. The etching may be continued until the gate electrode 8 has been exposed for further processing.

FIGS. 11a-11c illustrate the placement of a second photoresist 24 on the gate electrode layer 8, the fins 4, the first spacer 10 and the second spacer 12. The second photoresist 24 may be formed in a similar fashion and from similar materials as the first photoresist 14 (discussed above with respect to FIGS. 3a-3c). However, the second photoresist 24 may alternatively be a different material and may be formed in a different fashion from the first photoresist 14.

FIGS. 12a-12c illustrate a patterning of the second photoresist 24 into a mask that will be used to separate the gate electrode layer 8 into a plurality of individual gate electrodes 15 (as described further below with respect to FIGS. 13a-13c). In an embodiment the second photoresist 24 may be patterned by exposing and developing the second photoresist 24 in a similar manner as the first photoresist 14 was exposed and developed (as described above with respect to FIGS. 6a-6c).

FIGS. 13a-13c illustrate a transfer of the pattern from the second photoresist 24 to the gate electrode layer 8 to separate the gate electrode layer 8 into individual gate electrodes 15 and to form a first opening 13 between the individual gate electrodes 15. This transfer may be performed by performing a dry etch while using the second photoresist 24 as a mask to protect those portions of the gate electrode layer 8 that are not to be removed. In an embodiment this transfer may be performed to separate the single layer of the gate electrode layer 8 into separate individual gate electrodes 15, and, in an embodiment in which the gate electrode 8 is polysilicon, may be referred to as "cutting the polysilicon line."

This separation or cutting of the gate electrode layer 8 into the individual gate electrodes 15 may be performed after the removing of the hard mask 2 (described above with respect to FIGS. 10a-10c). If the separation is performed prior to the removal of the hard mask 2, this process may lead to a rounding of the edges of the gate electrodes 15 and a more rounded profile in the region of the gate electrode 8 where the separation or cut is performed. This could lead to negative effects and also cause the processing margins to be widened in order to take these rounded corners into account for further processing. Additionally, by having the rounded corners, an epitaxial growth for a source/drain regions will cause the newly grown material to take on an undesirable mushroom shape as it grows and begins to laterally extend over the rounded corners, which may cause undesired bridging of material, especially in weaker corner positions.

However, by performing the separation after the hard mask 2 is removed as described above, a more vertical profile with sharper corners may be obtained, and the effects of a rounded edge or rounded profile may be reduced or eliminated. Additionally, by obtaining a more vertical profile, the overall process margins for the manufacturing does not have to take these rounded corners into account, thereby allowing for a reduction in the process margins for the manufacturing process. Finally, with sharper and more vertical corners, any epitaxial growth that may be performed adjacent to the gate electrodes 15 will have a reduced or eliminated mushroom effect.

FIGS. 14a-14c illustrate a removal of the second photoresist 24. In an embodiment the second photoresist 24 may be removed using a process such as ashing, whereby the temperature of the second photoresist 24 is increased until the second photoresist 24 decomposes and may be removed. However, the embodiments are not intended to be limited to ashing, as any other suitable process may alternatively be utilized to remove the second photoresist 24.

FIGS. 15a-15c illustrate the deposition of a first contact etch stop layer (CESL) 16 on the gate electrodes 15, the fins 4, the first spacer 10, the second spacer 12, and the STIs 6. The first CESL 16 may be formed of silicon nitride, although other materials, such as nitride, oxynitride, boron nitride, combinations thereof, or the like, may alternatively be used. The first CESL 16 may be formed through CVD and may have a thickness of between about 5 nm and about 200 nm, such as about 80 nm. However, other methods of formation and other materials may alternatively be used.

Optionally, and as illustrated in FIGS. 15*a* and 15*b*, the first CESL 16 at the bottom of the first opening 13 between the gate electrodes 15 may be removed. In an embodiment the removal of the first CESL 16 may be performed using a photolithographic masking and etching process to remove the first CESL 16 from the bottom of the first opening 13. However, any suitable process for removing the first CESL 16 from the bottom of the first opening 13 may alternatively be utilized.

FIGS. 16*a*-16*c* illustrate the deposition of an interlayer dielectric (ILD) 18 on the STI 6 and the first CESL 16 and also deposited within the first opening 13 between the gate electrodes 15. Because of the first CESL 16, the ILD 18 may not directly contact the gate electrodes 15. The ILD 18 may be formed by initially forming an ILD material layer (not individually illustrated) using chemical vapor deposition, sputtering, or any other methods known and used in the art for forming an ILD. This initial deposition may be performed in order to fill and overfill the first opening 13 between the gate electrodes 15. Once the first opening 13 between the gate electrodes 15 has been overfilled, the ILD material layer may be planarized using, e.g., a CMP process to remove any ILD material from outside of the first opening 13 between the gate electrodes 15. The ILD 18 may be comprised of silicon oxide, although other materials, such as high-k materials, could alternately be used.

FIGS. 17*a*-17*c* illustrate the removal of a portion of the first CESL 16 and the ILD 18 that is located above the gate electrodes 15. This removal may be performed through a process such as chemical mechanical polishing (CMP) process, in which the ILD 18 and first CESL 16 are reacted and then ground away using an abrasive. The removal may continue until the gate electrodes 15 have been exposed for further processing.

FIGS. 18*a*-18*c* illustrate an optional removal of the gate electrodes 15 so that the material of the gate electrodes 15 may be replaced with another material. This may be desirable in order to take advantage of the processing attributes of a first material (such as polysilicon) to, e.g., obtain a sharper corner than would be obtainable with a second material. However, the second material may have a more advantageous property during operation than the first material. As such, the first material may be used to initially form the gate electrodes 15 in order to obtain the benefits of the first material during processing, and then the first material may be replaced with a second material in order to obtain the more advantageous attribute for operation.

For example, in an embodiment in which the first conductive material 11 of the gate electrodes 15 is initially polysilicon, the first conductive material 11 of the gate electrodes 15 may then be removed as a part of a replace polysilicon gate (RPG) process while leaving the first CESL 16 and the ILD 18 in place. The removal of the first conductive material 11 of the gate electrodes 15 may be performed using a wet or a dry etch, such as a wet etch with hydrogen bromide (HBr). In an embodiment, the removal may be continued until the first conductive material 11 of the gate electrodes 15 is removed and the STIs 6 are exposed, leaving the first spacer 10, the second spacer 12, the gate dielectric 9, the first CESL 16, and the ILD 18.

FIGS. 19*a*-19*c* illustrate a deposition of a second conductive material 20 in the region that was occupied by the first conductive material 11 of the gate electrodes 15. The second conductive material 20 is different from the first conductive material 11, but may similarly be selected from a group comprising of polycrystalline-silicon (poly-Si), poly-crystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The second conductive material 20 may be deposited by chemical vapor deposition (CVD), sputter deposition, or other techniques suitable for depositing conductive materials. The thickness of the second conductive material 20 may be in the range of about 200 angstroms to about 4,000 angstroms. After deposition the top surface of the second conductive material 20 may have a non-planar top surface, and may be planarized prior to patterning of the second conductive material 20 or gate etch.

Once the gate electrodes 15 have been finalized, the fins 4 may be further processed in order to complete the manufacturing of transistors within the fins 4. For example, portions of the fins 4 not covered by the gate dielectric 9 or the gate electrodes 15 may be removed and semiconductor material may be epitaxially grown and doped in order to form source and drain regions on either side of the gate dielectric 4. Additionally, silicide regions, overlying dielectric layers, and contacts may be formed in order to connect the transistors formed from the fins 4 within other circuitry. Any suitable processing steps may be utilized to complete the manufacturing of transistors or other devices within the fins 4 that have a sharper and less rounded profile.

FIGS. 20*a* through 30*c* illustrate another embodiment in which, instead of forming the first CESL 16 after the gate electrode layer 8 has been patterned in to the individual gate electrodes 15, a second CESL 22 is formed over the gate electrode layer 8 prior to patterning of the gate electrode layer 8 into the individual gate electrodes 15. In this embodiment, the initial steps may be similar to the steps illustrated above with respect to FIGS. 1*a* through 10*c* and, as such, are not repeated herein. As such, looking at FIGS. 20*a*-20*c*, these figures illustrate the formation of the second CESL 22 on the gate electrode 8, the fins 4, the first spacer 10 and the second spacer 12. Similar to the first CESL 16, the second CESL 22 may be composed of silicon nitride and may be formed by CVD, although other materials, such as nitride, oxynitride, boron nitride, combinations thereof, or the like, and other methods of formation, may alternatively be used.

FIGS. 21*a*-21*c* illustrates a deposition of a third photoresist 26 on the second CESL 22. In an embodiment the third photoresist 26 may be formed in a similar fashion and from similar materials as the first photoresist 14 (discussed above with respect to FIGS. 3*a*-3*c*). However, the third photoresist 26 may alternatively be a different material formed in a different fashion from the first photoresist 14.

FIGS. 22*a*-22*c* illustrate a patterning of the third photoresist 26 into a mask that will be used to separate the second CESL 22 and the gate electrode layer 8 into a plurality of individual gate electrodes 15 (as described further below with respect to FIGS. 23*a*-24*c*). In an embodiment the third photoresist 26 may be patterned by exposing and developing the third photoresist 26 in a similar manner as the first photoresist 14 was exposed and developed (as described above with respect to FIGS. 6a-6c).

FIGS. 23a-23c illustrate a transfer of the pattern of the third photoresist 26 from the third photoresist 26 to the second CESL 22 by etching the second CESL 22 through the third photoresist 26. The etching may be performed using dry etch process, although any other suitable etching process may alternatively be utilized.

FIGS. 24a-24c illustrate a transfer of the pattern from the second CESL 22 and the third photoresist 26 to the gate electrode layer 8 in order to separate or cut the gate electrode layer 8 into individual gate electrodes 15. This separation also forms a second opening 30 through the second CESL 22 and the gate electrode layer 8 between the gate electrodes 15. In an embodiment the pattern may be transferred to the gate electrode layer 8 by etching the gate electrode layer 8 through the third photoresist 26 and the second CESL 22. The gate electrode layer 8 may be etched by, for example, a dry etch process, although any suitable etching process may alternatively be utilized.

By separating or cutting the gate electrode layer 8 after the hard mask 2 has been removed (as discussed above with respect to FIGS. 10a-10c), the rounding of the gate electrodes 15 that would normally occur during of the removal of the hard mask 2 may be avoided. This avoidance may allow for a smaller process margin, as the rounded corners and their effect do not have to be taken into account. Additionally, by making the corners of the gate electrodes 15 sharper and less rounded, any mushroom effects that may occur during epitaxial growth (such as epitaxial growth that occurs during formation of source and drain regions), may be avoided.

FIGS. 25a-25c depict the removal of the third photoresist 26. In an embodiment the third photoresist 26 may be removed using a process such as ashing, whereby the temperature of the third photoresist 26 is increased until the third photoresist 26 decomposes and may be removed. However, the embodiments are not intended to be limited to ashing, as any other suitable process may alternatively be utilized to remove the third photoresist 26.

FIGS. 26a-26c illustrate the deposition of a second ILD 28. In an embodiment the second ILD 28 may be similar to the first ILD 18 (discussed above with respect to FIGS. 16a-16c), and may comprise silicon oxide and may be formed by CVD, although other materials, such as high-k materials, and other method of formation may alternately be used. The second ILD 28 may be deposited over the gate electrodes 15 and the second CESL 22, filling the second opening 30 formed by the patterning of the gate electrode layer 8 into the individual gate electrodes 15.

FIGS. 27a-27c illustrate a removal of a portion of the second ILD 28 above the second CESL 22 over the gate electrodes 15. This removal may be performed through a process such as a CMP process, in which the second ILD 28 is reacted and then ground away using an abrasive. The removal may continue until the second CESL 22 has been exposed for further processing over the gate electrodes 15.

FIGS. 28a-28c illustrate a removal of the second CESL 22 from over the gate electrodes 15. In an embodiment the second CESL 22 may be removed using a process such as a wet or dry etch. Alternatively, the second CESL 22 may be removed from over the gate electrodes 15 using a CMP process. Any suitable method for removing the second CESL 22 from over the gate electrodes 15 may alternatively be utilized.

FIGS. 29a-29c illustrate an optional replacement of the first conductive material of the gate electrodes 15 (as described above with respect to FIGS. 18a-18c). For example, in an embodiment in which the first conductive material 11 is polysilicon, the first conductive material 11 of the gate electrodes 15 may be removed be a etching process in order to expose the gate dielectric 9 as part of a replace poly gate (RPG) process.

FIGS. 30a-30c illustrate that, once the first conductive material 11 of the gate electrodes 15 has been removed, the second conductive material 20 may be formed or deposited over the gate dielectric 9 and fins 4. In an embodiment the second conductive material 20 may be deposited over the fins 4, the gate dielectric 9, and the second ILD 28. Once formed, portions of the second conductive material 20 over the second ILD 28 may be removed using, e.g., a CMP process.

However, by avoiding rounded corners in the original first conductive material 11, the second ILD 28 may have more vertical features and sharper corners. As such, when the second conductive material 20 is formed adjacent to the second ILD 28, the second conductive material 20 will have a similar profile with more vertical features and sharper corners. As such, the deleterious effects of rounded corners on the gate electrodes 15 may be reduced or eliminated.

Figure 31:
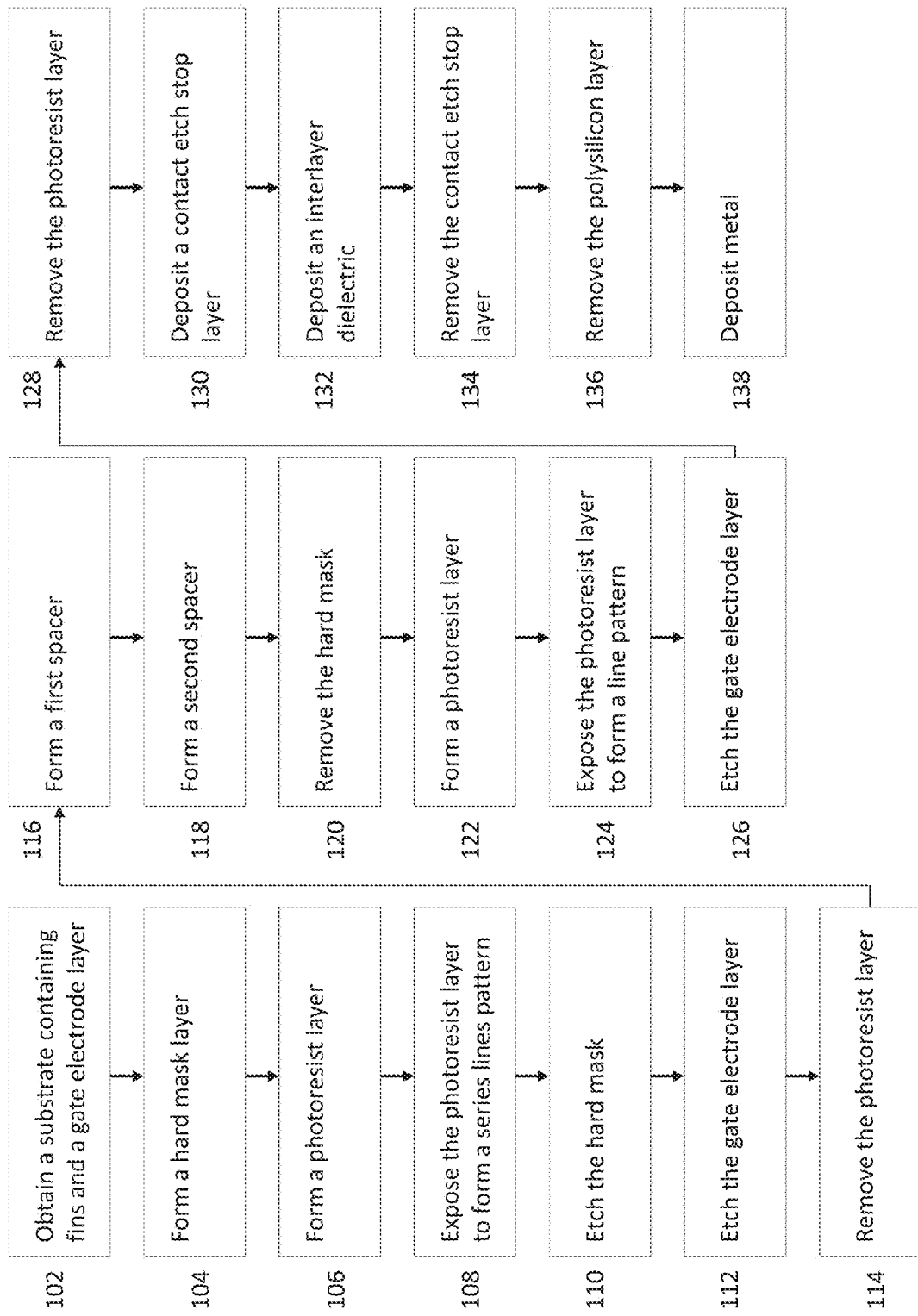
FIG. 31 is a flow diagram for a first fabrication process in accordance with an embodiment.

FIG. 31 illustrates a process flow diagram of the embodiment of the formation of FinFET devices described above with respect to FIG. 1a-19c. In block 102, a substrate with a fin structure, a STI, and a gate electrode layer is obtained. In block 104, a hard mask layer is formed on the gate electrode layer. A photoresist layer is then formed on the hard mask in block 106. Next, in block 108, the photoresist layer is exposed and developed to form a line pattern. The pattern is transferred to the hard mask by etching the hard mask in block 110, and to the gate electrode layer by etching the gate electrode layer in block 112. Next, the photoresist layer is removed in block 114. A first spacer is formed in block 116, and a second spacer is formed in block 118. In block 120, the hard mask is removed. A photoresist layer is deposited on the gate electrode layer in block 122. The photoresist layer is patterned and developed in a cut gate electrode line pattern in block 124. The pattern is etched into the gate electrode layer in block 126, cutting the gate electrode lines, and the photoresist is removed in block 128. Cutting the gate electrode lines is performed after removing the hard mask. In block 130, a CESL is deposited on the gate electrodes. In block 132, an ILD is deposited between the CESL in the area between gate electrodes. The CESL is removed in block 134, and the gate electrodes are removed in block 136. In block 138, a second conductive material such as metal is deposited where the gate electrodes had been in block 124.

Figure 32:
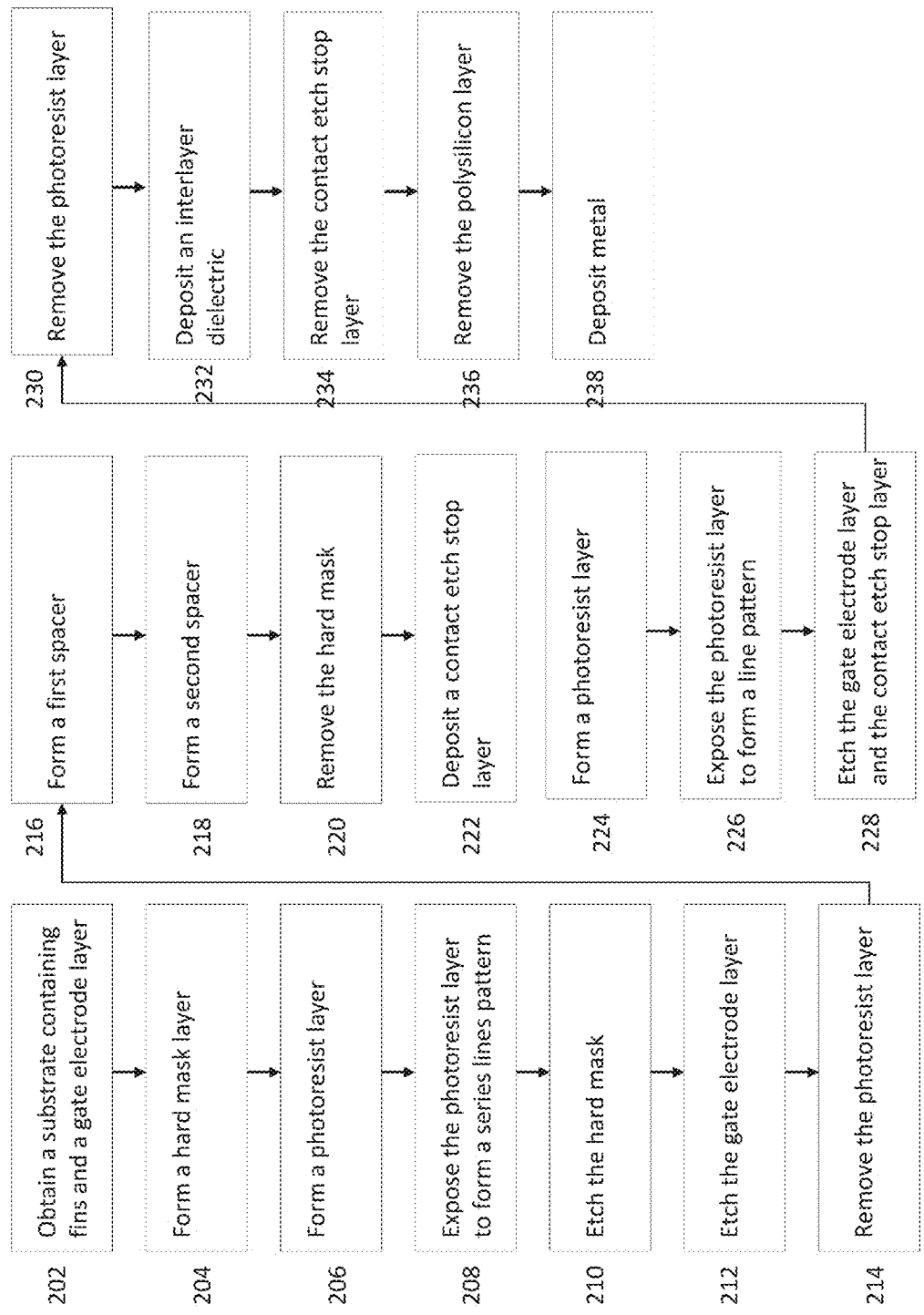
FIG. 32 is a flow diagram for a second fabrication process in accordance with an embodiment.

FIG. 32 illustrates a process flow chart for the embodiment discussed above with respect to FIGS. 20a-30c. In block 202, a substrate with a fin structure, a STI, and a gate electrode layer is obtained. In block 204, a hard mask layer is formed on the gate electrode layer. A photoresist layer is then formed on the hard mask in block 206. Next, in block 208, the photoresist layer is exposed and developed to form a line pattern. The pattern is transferred to the hard mask by etching the hard mask in block 210, and to the gate electrode layer by etching the gate electrode layer in block 212. Next, the photoresist layer is removed in block 214. A first spacer is formed in block 216, and a second spacer is formed in block 218. In block 220, the hard mask is removed. In block 222, a CESL is deposited on the gate electrodes. A photoresist layer is deposited on the gate electrode layer and the CESL in block 224. The photoresist layer is patterned and developed in a cut gate electrode line pattern in block 226. The pattern is etched into the gate electrode layer in block 228, cutting the gate electrode lines, and the photoresist is removed in block 230. Cutting the gate electrode lines is performed after removing the hard mask. In block 232, an ILD is deposited in the area between gate electrodes. The CESL is removed in block 234, and the gate electrodes are removed in block 236. In block 238, a second conductive material such as metal is deposited where the gate electrodes had been.

In accordance with an embodiment, a method of forming a semiconductor device comprising patterning a layer of conductive material with a first mask, the layer of conductive material located over at least one fin, is provided. The first mask is removed and a second mask is formed on the layer of conductive material. The layer of conductive material is patterned into a plurality of gate electrodes using the second mask.

In accordance with another embodiment, a method of fabricating a semiconductor device comprising forming a layer of conductive material over a fin and forming a hard mask over the layer of conductive material is provided. The layer of conductive material is patterned into a first strip and the hard mask is removed. A photoresist is formed over the first strip, and a portion of the first strip is removed through the photoresist to form a first gate electrode, a second gate electrode, and a first opening between the first gate electrode and the second gate electrode.

In accordance with yet another embodiment, a method of manufacturing a semiconductor device comprising forming a first mask on a conductive layer over a fin and patterning the conductive layer into a first row using the first mask is provided. A spacer is formed adjacent to a sidewall of the first row, and the first mask is removed. A second mask is formed over the first row and the spacer, and the first row is patterned into a first gate electrode and a second gate electrode using the second mask, the patterning the first row forming a first opening between the first gate electrode and the second gate electrode.

It should be appreciated that the materials, geometries, dimensions, structures, and process parameters described herein are exemplary only, and are not intended to be, and should not be construed to be, limiting to the embodiments claimed herein. Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines manufacture, compositions of matter, means, methods, or steps, presently existing or later to be developed, that perform substantially the same function or achieve substantially the same result as the corresponding embodiments described herein may be utilized according to the present disclosure. Accordingly, the claims are intended to include within their scope such processes, machines, manufacture, compositions of matter, means, methods, or steps.

What is claimed is:

1. A semiconductor device comprising:
   a plurality of fins over a substrate;
   a first gate electrode over a first set of the plurality of fins, the first gate electrode comprising a first sidewall and a second sidewall;
   a second gate electrode over a second set of the plurality of fins, the second gate electrode comprising a third sidewall facing the first sidewall and a fourth sidewall facing away from the first sidewall;
   a first spacer that extends to be in physical contact with both the second sidewall and the fourth sidewall; and
   a dielectric separator located between the first gate electrode and the second gate electrode, wherein the dielectric separator is also in physical contact with the first spacer, wherein the dielectric separator comprises a different material than the first spacer.

2. The semiconductor device of claim 1, wherein the dielectric separator further comprises:
   a first dielectric material located along the first sidewall and the third sidewall; and
   a second dielectric material filling a remainder of a space between the first gate electrode and the second gate electrode.

3. The semiconductor device of claim 1, wherein the first spacer has a planar top surface that is planar with the dielectric separator.

4. The semiconductor device of claim 1, wherein the first gate electrode comprises a first material and the second gate electrode comprises the first material.

5. The semiconductor device of claim 4, wherein the first material is polysilicon.

6. The semiconductor device of claim 1, wherein the first spacer is a composite spacer.

7. The semiconductor device of claim 1, wherein the first gate electrode is planar with the dielectric separator.

8. A semiconductor device comprising:
   a first strip of conductive material located over a first plurality of fins on a substrate, the first strip of conductive material having a first longitudinal axis;
   a second strip of conductive material located over a second plurality of fins on the substrate, the second strip of conductive material having a second longitudinal axis in line with the first longitudinal axis, wherein a first sidewall of the first strip of conductive material faces a second sidewall of the second strip of conductive material;
   a spacer extending from the first strip of conductive material to the second strip of conductive material, wherein the spacer does not extend to cover the first sidewall or the second sidewall, the spacer comprising a first dielectric material; and
   a second dielectric material different from the first dielectric material covering the first sidewall and the second sidewall and extending from the first strip of conductive material to the second strip of conductive material.

9. The semiconductor device of claim 8, wherein the second dielectric material further comprises:
   a first material located along the first sidewall and the second sidewall; and
   a second material filling a remainder of a space between the first strip of conductive material and the second strip of conductive material.

10. The semiconductor device of claim 8, wherein the spacer has a planar top surface that is planar with the second dielectric material.

11. The semiconductor device of claim 8, wherein the first strip of conductive material comprises a first conductive material and the second strip of conductive material comprise the first conductive material.

12. The semiconductor device of claim 11, wherein the first conductive material is polysilicon.

13. The semiconductor device of claim 8, wherein the spacer is a composite spacer.

14. The semiconductor device of claim 8, wherein the first strip of conductive material is planar with the second dielectric material.

15. A semiconductor device comprising:
- a first gate electrode over a first plurality of fins on a substrate;
- a second gate electrode over a second plurality of fins on a substrate, the second gate electrode being aligned with the first gate electrode;
- a first opening between the first gate electrode and the second gate electrode;
- a first spacer extending from a first sidewall of the first gate electrode to a second sidewall of the second gate electrode, wherein the first spacer extends above the first gate electrode;
- a photoresist located over the first gate electrode, the second gate electrode, and the first spacer; and
- a second opening in the photoresist, wherein the second opening is aligned with the first opening.

16. The semiconductor device of claim 15, wherein the first spacer is a composite spacer.

17. The semiconductor device of claim 15, wherein the first gate electrode and the second gate electrode are planar to each other.

18. The semiconductor device of claim 15, wherein the first gate electrode is a first material and the second gate electrode is the first material.

19. The semiconductor device of claim 18, wherein the first material is polysilicon.

20. The semiconductor device of claim 15, wherein the first spacer surrounds the first gate electrode and the second gate electrode.

* * * * *